US011764085B2

(12) United States Patent
Masuda et al.

(10) Patent No.: US 11,764,085 B2
(45) Date of Patent: Sep. 19, 2023

(54) PROCESSING APPARATUS

(71) Applicant: DISCO CORPORATION, Tokyo (JP)

(72) Inventors: Yukiyasu Masuda, Tokyo (JP);
Yoshikuni Migiyama, Tokyo (JP);
Takashi Uchiho, Tokyo (JP); Ryosuke
Kurosawa, Tokyo (JP); Toshiyuki
Yoshikawa, Tokyo (JP); Toshio
Tsuchiya, Tokyo (JP); Masanobu
Takenaka, Tokyo (JP); Tomoyuki
Hongo, Tokyo (JP); Takashi Mori,
Tokyo (JP); Yoshinori Kakinuma,
Tokyo (JP); Yoshinobu Saito, Tokyo
(JP); Jonghyun Ryu, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 17/371,720

(22) Filed: Jul. 9, 2021

(65) Prior Publication Data
US 2022/0020614 A1 Jan. 20, 2022

(30) Foreign Application Priority Data

Jul. 17, 2020 (JP) ................................ 2020-123201

(51) Int. Cl.
B32B 43/00 (2006.01)
H01L 21/67 (2006.01)
H01L 21/683 (2006.01)

(52) U.S. Cl.
CPC .... H01L 21/67132 (2013.01); H01L 21/6836 (2013.01); B32B 43/006 (2013.01); Y10T 156/1184 (2015.01); Y10T 156/1967 (2015.01)

(58) Field of Classification Search
CPC ............. B32B 43/006; Y10T 156/1184; Y10T 156/1967
See application file for complete search history.

(56) References Cited

U.S. PATENT DOCUMENTS 7,598,120 B2 * 10/2009 Yamamoto ........ H01L 21/67132
438/106
8,486,806 B2 * 7/2013 Hirosawa .......... H01L 21/67132
438/464

(Continued)

FOREIGN PATENT DOCUMENTS

JP 2010062375 A 3/2010

Primary Examiner — Philip C Tucker
Assistant Examiner — Nickolas R Harm
(74) Attorney, Agent, or Firm — GREER BURNS & CRAIN, LTD.

(57) ABSTRACT

A processing apparatus includes a wafer conveying-out mechanism; a wafer table; a frame conveying-out mechanism; a frame table; a tape attaching mechanism that attaches a tape to a frame; a tape-attached frame conveying mechanism that conveys the tape-attached frame; a tape pressure bonding mechanism that pressure bonds the tape of the tape-attached frame to a back surface of a wafer; a frame unit conveying-out mechanism that conveys out a frame unit in which the tape of the tape-attached frame and the back surface of the wafer are pressure bonded; a reinforcement section removing mechanism that cuts and removes a ring-shaped reinforcement section from the wafer; a ringless unit conveying-out mechanism that conveys out a ringless unit from which the reinforcement section has been removed; and a frame cassette table on which a frame cassette accommodating the ringless unit is to be placed.

15 Claims, 15 Drawing Sheets

(56) References Cited

U.S. PATENT DOCUMENTS

| | | | |
|---|---|---|---|
| 2003/0088959 A1* | 5/2003 | Tsujimoto | H01L 21/67132 29/25.01 |
| 2003/0133762 A1* | 7/2003 | Yamamoto | H01L 21/6838 406/198 |
| 2005/0236114 A1* | 10/2005 | Yanagita | H01L 21/67745 156/391 |
| 2007/0181245 A1* | 8/2007 | Kaneshima | H01L 21/67132 156/499 |
| 2007/0231929 A1* | 10/2007 | Kajiyama | H01L 21/67132 438/6 |
| 2008/0044258 A1* | 2/2008 | Akechi | H01L 21/6835 414/222.01 |
| 2009/0011572 A1* | 1/2009 | Kaneko | B23K 26/0853 134/1.2 |
| 2009/0057841 A1* | 3/2009 | Sekiya | H01L 23/544 257/E23.179 |
| 2009/0139662 A1* | 6/2009 | Nakamura | H01L 21/67346 156/764 |
| 2010/0055877 A1* | 3/2010 | Kajiyama | H01L 21/6836 438/464 |
| 2011/0297329 A1* | 12/2011 | Canale | H01L 21/67092 156/756 |
| 2013/0089970 A1* | 4/2013 | Amada | B24B 7/228 257/E21.237 |
| 2014/0234033 A1* | 8/2014 | Iwashita | H01L 21/6838 406/88 |
| 2015/0251902 A1* | 9/2015 | Bernales | B81C 1/00904 438/50 |
| 2015/0306774 A1* | 10/2015 | Abe | H01L 21/6838 294/64.3 |
| 2015/0332909 A1* | 11/2015 | Suzuki | H01L 21/02019 438/691 |
| 2015/0332928 A1* | 11/2015 | Priewasser | H01L 21/67046 438/460 |
| 2017/0301571 A1* | 10/2017 | Tsuchiya | H01L 21/6836 |
| 2019/0006185 A1* | 1/2019 | Suzuki | H01L 21/78 |
| 2019/0006212 A1* | 1/2019 | Iizuka | B23K 26/0869 |
| 2019/0181026 A1* | 6/2019 | Yamakawa | B25J 9/1697 |
| 2020/0075311 A1* | 3/2020 | Osaga | H01L 21/76862 |
| 2020/0333702 A1* | 10/2020 | Iwatani | H01L 21/67173 |
| 2020/0354161 A1* | 11/2020 | Yoshida | H01L 21/681 |

\* cited by examiner

PROCESSING APPARATUS

BACKGROUND OF THE INVENTION

Field of the Invention

The present invention relates to a processing apparatus for removing, from a wafer formed with a ring-shaped reinforcement section in a projection form on a back surface side in a peripheral marginal area, the projection-shaped reinforcement section.

Description of the Related Art

A wafer formed, on a front surface thereof, with a device area in which a plurality of devices such as integrated circuits (ICs) and large-scale integrated circuits (LSIs) are partitioned by streets and a peripheral marginal area surrounding the device area is ground on a back side to be formed to a desired thickness, and is thereafter divided into individual device chips by a dicing apparatus or a laser processing apparatus. The thus divided device chips are used for electric apparatuses such as mobile phones and personal computers.

The present applicant has proposed a technology in which, for facilitating the conveyance of the ground wafer, predetermined processing is conducted while a ring-shaped reinforcement section is left on the back side of the wafer corresponding to the peripheral marginal area, after which a tape (dicing tape) is attached to the back surface of the wafer, the wafer is supported by a frame, and the ring-shaped reinforcement section is removed from the wafer (see, for example, Japanese Patent Laid-open No. 2010-62375).

SUMMARY OF THE INVENTION

However, it is difficult to perform an operation of attaching a tape to the back surface of the wafer with a ring-shaped reinforcement section in a projection form formed on the back surface corresponding to the peripheral marginal area, to unite the wafer with the frame. Also, it is difficult to cut and remove the ring-shaped reinforcement section from the wafer. Thus, there is a problem of poor productivity.

Accordingly, it is an object of the present invention to provide a processing apparatus by which an operation of attaching a tape to the back surface of a wafer with a ring-shape reinforcement section in a projection form formed on the back surface corresponding to the peripheral marginal area, to unite the wafer with a frame, can easily be carried out, and by which the ring-shaped reinforcement section can easily be cut and removed from the wafer.

In accordance with an aspect of the present invention, there is provided a processing apparatus for removing, from a wafer with a ring-shaped reinforcement section in a projection form formed on a back surface corresponding to a peripheral marginal area, the projection-shaped reinforcement section, the processing apparatus including a wafer cassette table on which a wafer cassette accommodating a plurality of wafers is to be placed; a wafer conveying-out mechanism that conveys out the wafer from the wafer cassette placed on the wafer cassette table; a wafer table that supports a front surface side of the wafer conveyed out by the wafer conveying-out mechanism; a frame accommodating device that accommodates a plurality of ring-shaped frames each formed with an opening for accommodating the wafer; a frame conveying-out mechanism that conveys out the frame from the frame accommodating device; a frame table that supports the frame conveyed out by the frame conveying-out mechanism; a tape attaching mechanism that is disposed on an upper side of the frame table and attaches a tape to the frame; a tape-attached frame conveying mechanism that conveys the tape-attached frame to the wafer table, positions an opening of the frame to the back surface of the wafer supported by the wafer table, and places the tape-attached frame on the wafer table; a tape pressure bonding mechanism that pressure bonds the tape of the tape-attached frame to the back surface of the wafer; a frame unit conveying-out mechanism that conveys out, from the wafer table, a frame unit in which the tape of the tape-attached frame and the back surface of the wafer are pressure bonded by the tape pressure bonding mechanism; a reinforcement section removing mechanism that cuts and removes the ring-shaped reinforcement section from the wafer of the frame unit conveyed out by the frame unit conveying-out mechanism; a ringless unit conveying-out mechanism that conveys out, from the reinforcement section removing mechanism, a ringless unit from which the ring-shaped reinforcement section has been removed; and a frame cassette table on which the frame cassette accommodating the ringless unit conveyed out by the ringless unit conveying-out mechanism is to be placed.

Preferably, the wafer conveying-out mechanism includes a conveying arm and a hand that is disposed at a tip of the conveying arm, that supports the back surface of the wafer accommodated in the wafer cassette, and that reverses the wafer face side back.

In addition, preferably, the hand is a Bernoulli pad in which a negative pressure is generated by jetting of air and the wafer is supported on a non-contact basis.

Besides, preferably, the wafer table includes an annular support section that supports the peripheral marginal area of the wafer, with a part on an inner side than the peripheral marginal area in a non-contact state, and a frame support section that is disposed at a periphery of the annular support section and supports the frame.

In addition, preferably, the tape attaching mechanism includes a roll tape support section that supports a roll tape in which the tape before use is rolled, a tape take-up section that takes up the used tape, a tape drawing section that draws out the tape from the roll tape, a pressure bonding section that pressure bonds the drawn-out tape to the frame, and a cutting section that cuts the tape protruding to a periphery of the frame, along the frame.

Besides, preferably, the tape pressure bonding mechanism includes an upper chamber disposed on an upper side of the wafer table, a lower chamber that accommodates the wafer table, a lift mechanism that moves the upper chamber upward and downward to generate a closed state in which the upper chamber is in contact with the lower chamber and an open state in which the upper chamber is spaced away from the lower chamber, a vacuum section that establishes a vacuum in the upper chamber and the lower chamber in the closed state, and an atmospheric opening section that opens the upper chamber and the lower chamber to the atmosphere, and, in a state in which the tape of the tape-attached frame is positioned on the back surface of the wafer supported by the wafer table, the lift mechanism is operated to establish a vacuum in the upper chamber and the lower chamber while the closed state is maintained, and the tape of the tape-attached frame is pressure bonded to the back surface of the wafer by a pressing roller disposed in the upper chamber.

In addition, preferably, the frame unit conveying-out mechanism includes a frame unit holding section that includes a wafer holding section for holding the wafer and a frame holding section for holding the frame and a conveying section that conveys the frame unit holding section to a temporary placing table.

Besides, preferably, the frame unit conveying-out mechanism includes a two-dimensional moving mechanism that moves the frame unit holding section on a two-dimensional basis in horizontal directions; and an imaging section that images a periphery of the wafer of the frame unit held by the frame unit holding section, and the two-dimensional moving mechanism is operated to image at least three parts of the periphery of the wafer by the imaging section, the coordinates of the center of the wafer are obtained, and the center of the wafer is made to coincide with the center of the temporary placing table.

In addition, preferably, the reinforcement section removing mechanism includes a laser beam applying unit that applies a laser beam toward a base of the ring-shaped reinforcement section formed at the periphery of the wafer and forms a cut groove, a first lift table that holds and raises the frame unit temporarily placed on the temporary placing table, to position the frame unit at the laser beam applying unit, and a separating section that separates the ring-shaped reinforcement section from the cut groove, the separating section includes an ultraviolet ray applying section that applies ultraviolet rays to the tape corresponding to the cut groove, to lower an adhesive force of the tape, a second lift table that suction-holds the inside of the wafer while exposing the ring-shaped reinforcement section on the periphery and supports the frame, a separator that acts on the periphery of the ring-shaped reinforcement section to separate the ring-shaped reinforcement section, and a discarding section that discards the separated ring-shaped reinforcement section, and the first lift table temporarily places the frame unit formed with the cut groove on the temporary placing table, the temporary placing table is positioned at the separating section by a table conveying section, and the second lift table supports the frame unit temporarily placed on the temporary placing table.

Besides, preferably, the temporary placing table includes a heater, and the first lift table holds, from the temporary placing table, the frame unit in which the tape is heated by the heater and the tape is put into close contact with the base of the ring-shaped reinforcement section.

In addition, preferably, the temporary placing table includes an annular support section that supports the peripheral marginal area of the wafer and puts a part on an inner side than the peripheral marginal area in a non-contact state; and a frame support section that is disposed at the periphery of the annular support section and supports the frame.

Besides, preferably, the ringless unit conveying-out mechanism includes a reversing mechanism that includes a frame holding section facing the ringless unit supported by the second lift table and holding the frame, moves toward the frame cassette table, and reverses the frame holding section; a ringless unit support section that supports the ringless unit being reversed by the reversing mechanism and having the front surface of the wafer directed upward; and a pushing-in section that causes the ringless unit supported by the ringless unit support section to enter into the frame cassette placed on the frame cassette table and to be accommodated in the frame cassette.

According to the processing apparatus according to an aspect of the present invention, an operation of attaching a tape to the back surface of a wafer with the ring-shaped reinforcement section in a projection form formed on the back surface corresponding to the peripheral marginal area, to unite the wafer with a frame, is easy to carry out, and cutting and removing the ring-shaped reinforcement section from the wafer are easy, so that productivity is good.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3 is a perspective view of a wafer cassette table depicted in FIG. 1, and the like;

FIG. 5 is a perspective view of a frame accommodating device depicted in FIG. 1, and the like;

FIG. 6A is a perspective view of a tape attaching mechanism in a state in which a frame table depicted in FIG. 1 is located at a lowered position, and the like;

FIG. 6B is a perspective view of the tape attaching mechanism in a state in which the frame table depicted in FIG. 1 is located at a raised position, and the like;

DETAILED DESCRIPTION OF THE PREFERRED EMBODIMENT

An embodiment according to an aspect of the present invention will be described below referring to the attached drawings.

Figure 1:
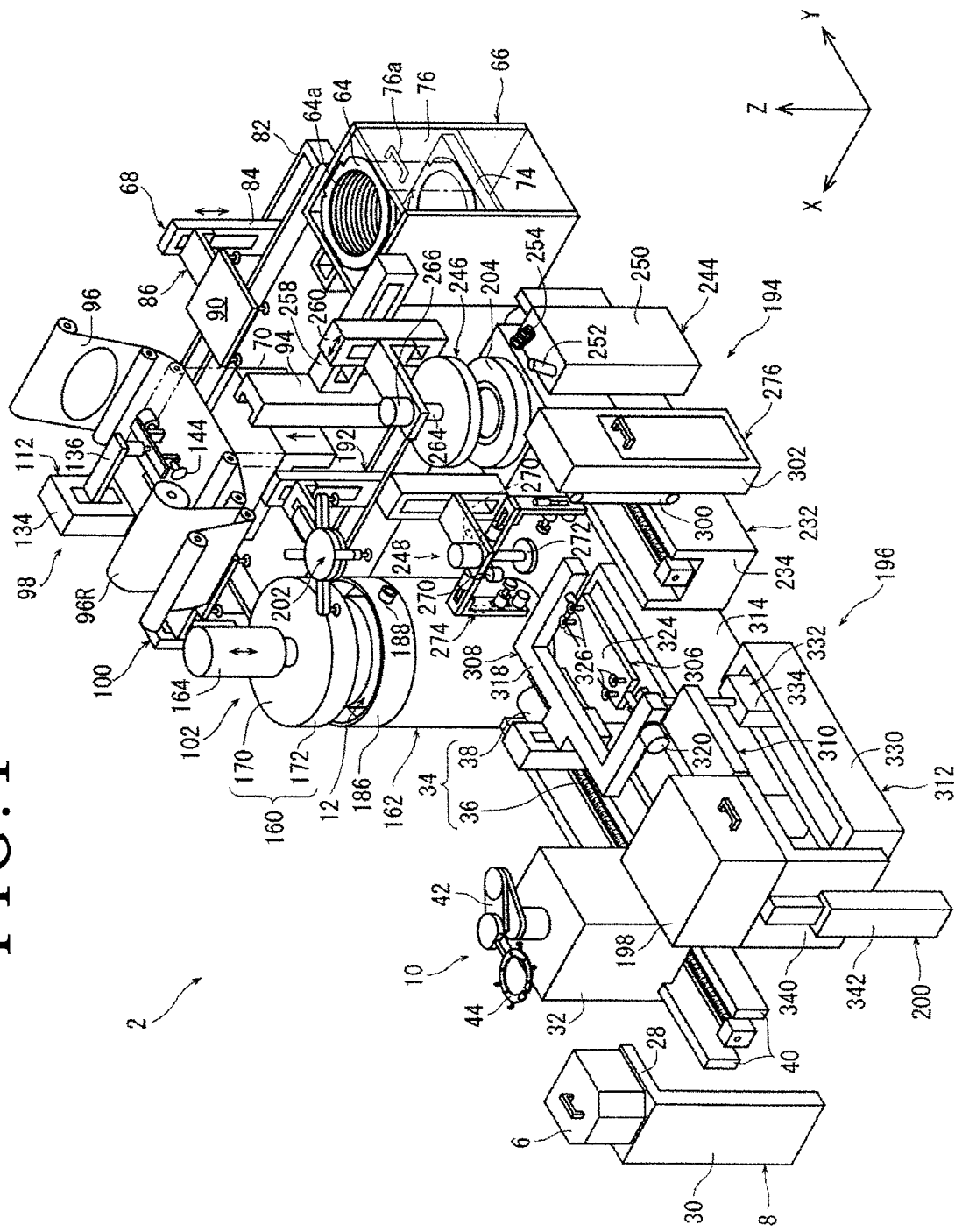
FIG. 1 is a perspective view of a processing apparatus according to the present embodiment.

Referring to FIG. 1, a processing apparatus denoted generally by a reference symbol 2 includes a wafer cassette table 8 on which a wafer cassette 6 accommodating a plurality of wafers is to be mounted, a wafer conveying-out mechanism 10 that conveys out the wafer from the wafer cassette 6 mounted on the wafer cassette table 8, and a wafer table 12 that supports a front surface side of the wafer conveyed out by the wafer conveying-out mechanism 10.

Figure 2:
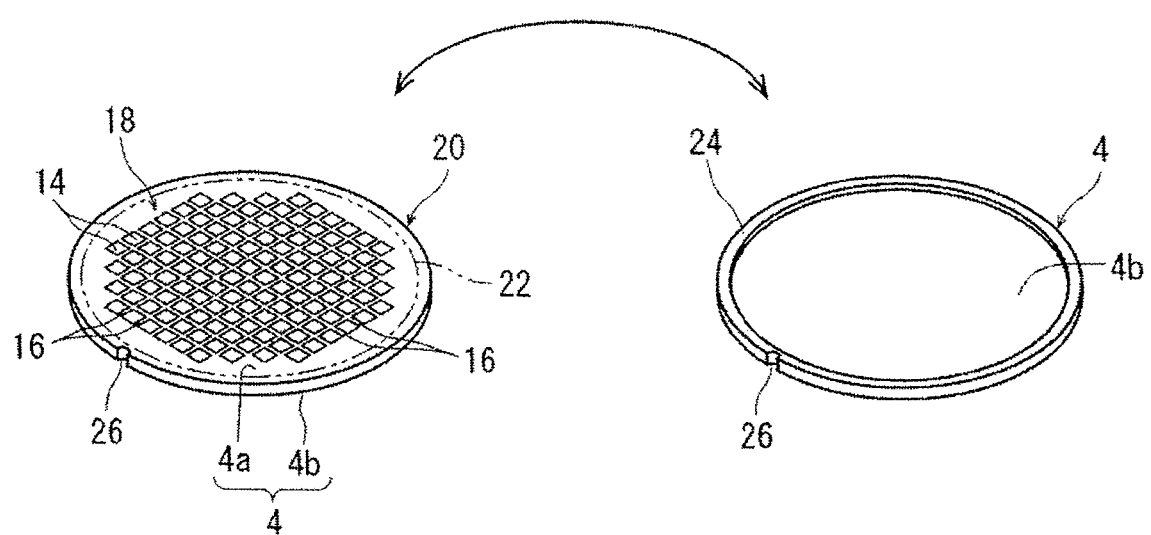
FIG. 2 is a perspective view of a wafer to be processed by the processing apparatus depicted in FIG. 1.

FIG. 2 depicts a wafer 4 to be processed by the processing apparatus 2. A front surface 4a of the wafer 4 is formed with a device area 18 in which a plurality of devices 14 such as ICs and LSIs are partitioned by streets 16 formed in a grid pattern; and a peripheral marginal area 20 surrounding the device area 18. While a boundary 22 between the device area 18 and the peripheral marginal area 20 is indicated by an alternate long and two short dashes line for the sake of convenience, in reality, the line indicating the boundary 22 is absent. On the side of a back surface 4b of the wafer 4, a ring-shaped reinforcement section 24 is formed in a projection form in the peripheral marginal area 20, and the thickness of the peripheral marginal area 20 is greater than the thickness of the device area 18. In addition, a circumferential edge of the wafer 4 is formed with a cutout 26 indicating the crystal orientation.

Figure 3:
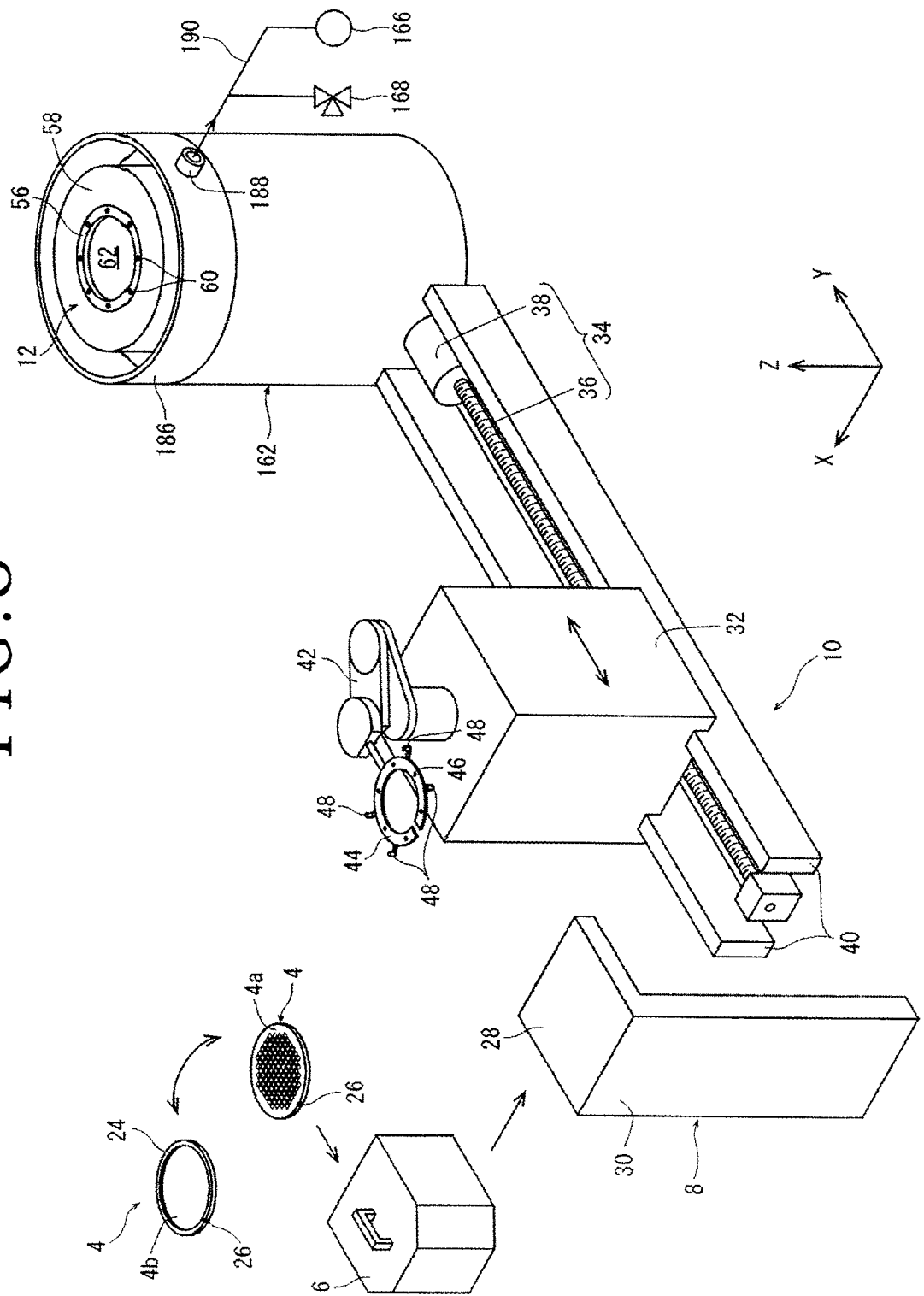

As illustrated in FIG. 3, a plurality of wafers 4 in a state in which the front surface 4a is directed upward are accommodated at vertical intervals in the wafer cassette 6. The wafer cassette table 8 in the embodiment depicted has a top plate 28 on which the wafer cassette 6 is to be placed and a support plate 30 supporting the top plate 28. Note that the top plate 28 may be moved up and down, and a lift mechanism that moves the top plate 28 upward and downward to position the top plate 28 at any height may be provided.

Referring to FIG. 3 for continuing description, the wafer conveying-out mechanism 10 includes a Y-axis movable member 32 movable in a Y-axis direction indicated by an arrow Y in FIG. 3 and a Y-axis feeding mechanism 34 that moves the Y-axis movable member 32 in the Y-axis direction. The Y-axis feeding mechanism 34 has a ball screw 36 that is connected to an end portion of the Y-axis movable member 32 and that extends in the Y-axis direction and a motor 38 that rotates the ball screw 36. The Y-axis feeding mechanism 34 converts a rotational motion of the motor 38 into a rectilinear motion and transmits the rectilinear motion to the Y-axis movable member 32 by the ball screw 36, and moves the Y-axis movable member 32 in the Y-axis direction along a pair of guide rails 40 extending in the Y-axis direction. Note that an X-axis direction indicated by an arrow X in FIG. 3 is a direction orthogonal to the Y-axis direction, and a Z-axis direction indicated by an arrow Z in FIG. 3 is the vertical direction orthogonal to both the X-axis direction and the Y-axis direction. An XY plane defined by the X-axis direction and the Y-axis direction is a substantially horizontal plane.

As depicted in FIG. 3, the wafer conveying-out mechanism 10 in the embodiment depicted includes a conveying arm 42 and a hand 44 that is disposed at a tip of the conveying arm 42, that supports the back surface 4b of the wafer 4 accommodated in the wafer cassette 6, and that reverses the wafer 4 upside down. The conveying arm 42 is provided on an upper surface of the Y-axis movable member 32, and is driven by an appropriate drive source (not illustrated) such as an air drive source or an electric drive source. The drive source drives the conveying arm 42 to position the hand 44 at any position in each of the X-axis direction, the Y-axis direction, and the Z-axis direction, and reverses the hand 44 upside down.

Figure 4:
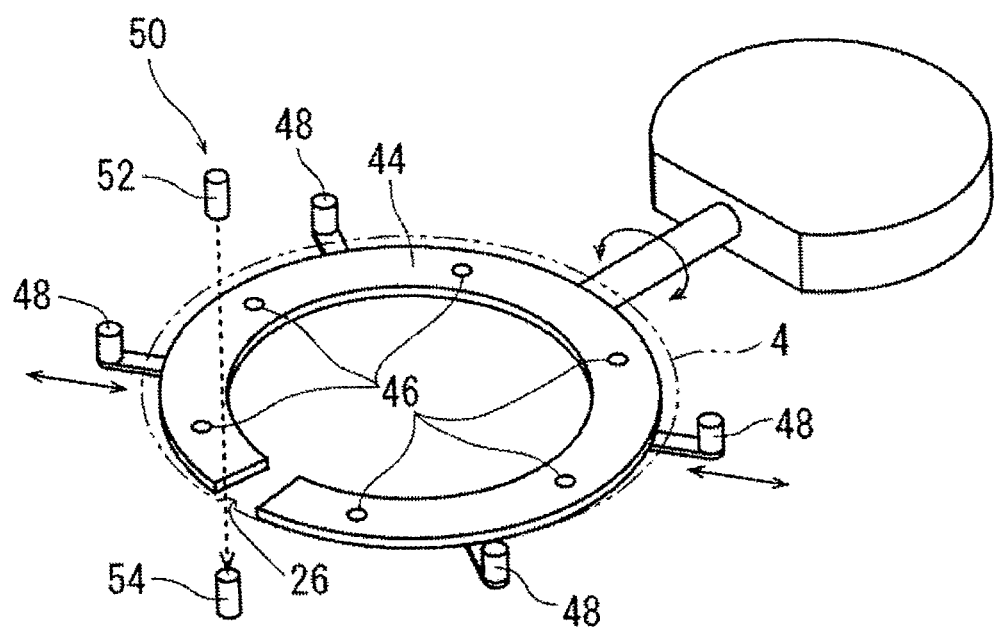
FIG. 4 is a perspective view of a hand depicted in FIG. 1.

Referring to FIG. 4 for description, the hand 44 is preferably a Bernoulli pad that supports the wafer 4 on a non-contact basis by generating a negative pressure by air jetting. The hand 44 in the embodiment depicted is C-shaped as a whole, and a side surface of the hand 44 is formed with a plurality of air jet ports 46 connected to a compressed air supply source (not illustrated). On a peripheral edge of the hand 44, a plurality of guide pins 48 are additionally provided at intervals in the circumferential direction. Each of the guide pins 48 is configured to be movable in the radial direction of the hand 44.

As depicted in FIGS. 3 and 4, the wafer conveying-out mechanism 10 positions the hand 44 on the back surface 4b side (lower side) of the wafer 4 in the wafer cassette 6 mounted on the wafer cassette table 8, after which compressed air is jetted from the air jet ports 46 of the hand 44 to generate a negative pressure on one surface side of the hand 44 by the Bernoulli effect, and the wafer 4 is suction-supported by the hand 44 on a non-contact basis from the back surface 4b side. Horizontal movement of the wafer 4 suction-held by the hand 44 is restricted by each of the guide pins 48. By moving the Y-axis movable member 32 and the conveying arm 42, the wafer conveying-out mechanism 10 conveys out the wafer 4 suction-supported by the hand 44, from the wafer cassette 6.

As depicted in FIG. 4, the wafer conveying-out mechanism 10 in the embodiment illustrated includes a cutout detection unit 50 that detects the position of the cutout 26 of the wafer 4. The cutout detection unit 50 may include, for example, a light emitting element 52 and a light receiving element 54 disposed with a vertical interval therebetween and a drive source (not illustrated) that rotates at least one of the guide pins 48 of the hand 44.

The light emitting element 52 and the light receiving element 54 can be added to the Y-axis movable member 32 or a conveying path through an appropriate bracket (not illustrated). In addition, when the guide pin 48 is rotated by the drive source, the wafer 4 suction-supported by the hand 44 is rotated due to the rotation of the guide pin 48. For securely transmitting rotation from the guide pin 48 to the wafer 4, the peripheral surface of the guide pin 48 rotated by the drive source is preferably formed of an appropriate synthetic rubber.

The cutout detection unit 50 can detect the position of the cutout 26 by rotating the wafer 4 by the drive source through the guide pin 48, in a state in which the wafer 4 is suction-supported by the hand 44 and the periphery of the wafer 4 is positioned between the light emitting element 52 and the light receiving element 54. As a result, the orientation of the wafer 4 can be adjusted to any direction.

As illustrated in FIG. 3, the wafer table 12 is disposed adjacent to the wafer conveying-out mechanism 10. The wafer table 12 in the embodiment illustrated includes an annular support section 56 that supports the peripheral marginal area 20 of the wafer 4 and that keeps the part on the inner side than the peripheral marginal area 20 in a non-contact state; and a frame support section 58 that is disposed at the periphery of the annular support section 56 and supports a frame 64 (see FIG. 5) which will be described later. An upper surface of the annular support section 56 is formed with a plurality of suction holes 60 disposed at intervals in the circumferential direction, and each of the suction holes 60 is connected to a suction source (not illustrated) such as a vacuum pump. That part of the wafer table 12 which is located on the radial directionally inner side than the annular support section 56 is a downwardly hollowed circular recess 62.

When the hand 44 is reversed by 180° to reverse the wafer 4 face side back and the wafer 4 is mounted on the wafer table 12 in a state in which the front surface 4a of the wafer 4 is directed downward, the peripheral marginal area 20 of the wafer 4 is supported by the annular support section 56, and the device area 18 of the wafer 4 is located at the recess 62. Thus, even if the wafer 4 is mounted on the wafer table 12 in a state in which the front surface 4a formed with the devices 14 is directed downward, the devices 14 and the wafer table 12 do not make contact with each other, so that damaging of the devices 14 is prevented. In addition, after supporting the peripheral marginal area 20 by the annular support section 56, the wafer table 12 operates the suction source to generate a suction force at each of the suction holes 60 and to suction-hold the peripheral marginal area 20, whereby positional deviation of the wafer 4 is prevented.

Figure 5:
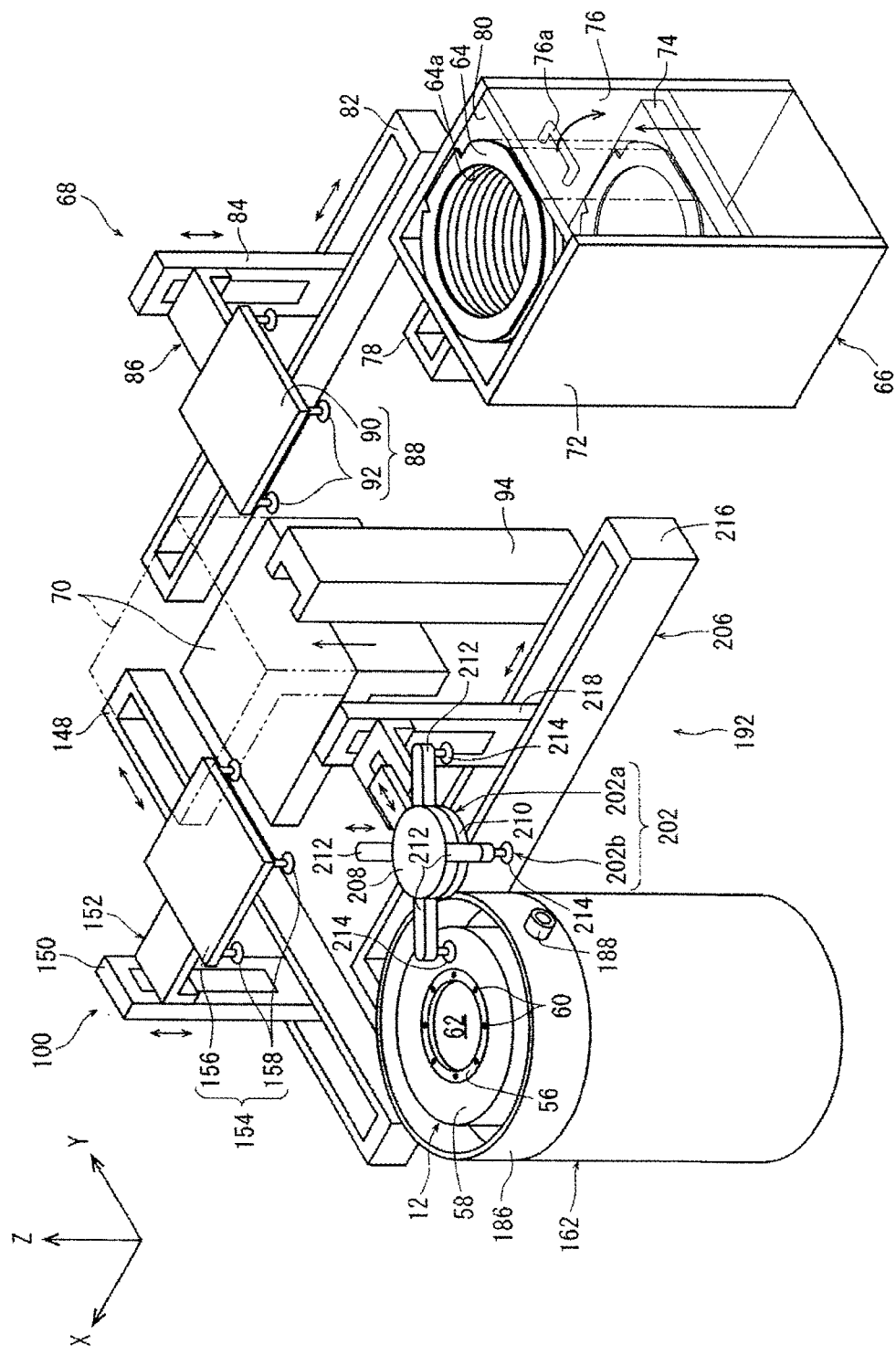

Referring to FIG. 5 for description, the processing apparatus 2 further includes a frame accommodating device 66 that accommodates a plurality of ring-shaped frames 64 each formed with an opening 64a for accommodating the wafer 4, a frame conveying-out mechanism 68 that conveys out the frame 64 from the frame accommodating device 66, and a frame table 70 that supports the frame 64 conveyed out by the frame conveying-out mechanism 68.

As depicted in FIG. 5, the frame accommodating device 66 in the embodiment illustrated includes a housing 72, a lift plate 74 disposed in the housing 72 to be liftable up and down, and a lift mechanism (not illustrated) that moves the lift plate 74 up and down. On a side surface on the X-axis directionally depth side of the housing 72 in FIG. 5, a Z-axis guide member 78 extending in the Z-axis direction is disposed. The lift plate 74 is supported by the Z-axis guide member 78 to be liftable up and down, and the lift mechanism that moves the lift plate 74 up and down is disposed inside the Z-axis guide member 78. The lift mechanism may have, for example, a ball screw that is connected to the lift plate 74 and that extends in the Z-axis direction and a motor for rotating the ball screw. On a side surface on the X-axis directionally viewer's side of the housing 72 in FIG. 5, a door 76 with a handle 76a added thereto is provided, and, in the frame accommodating device 66, by grasping the handle 76a and opening the door 76, the frame 64 can be accommodated inside the housing 72. In addition, an opening 80 is provided at an upper end of the housing 72.

As depicted in FIG. 5, the frames 64 are accommodated in the state of being superimposed on an upper surface of the lift plate 74 inside the housing 72. Of the superimposed plurality of frames 64, the uppermost frame 64 is conveyed out by the frame conveying-out mechanism 68 from the opening 80 of the housing 72. In addition, when the frame 64 is conveyed out from the opening 80, the frame accommodating device 66 appropriately lifts up the lift plate 74 by the lift mechanism, and positions the uppermost frame 64 at such a position that it can be conveyed out by the frame conveying-out mechanism 68.

Referring to FIG. 5 for continuing description, the frame conveying-out mechanism 68 includes an X-axis guide member 82 that is fixed to an appropriate bracket (not illustrated) and that extends in the X-axis direction, an X-axis movable member 84 supported by the X-axis guide member 82 movably in the X-axis direction, an X-axis feeding mechanism (not illustrated) that moves the X-axis movable member 84 in the X-axis direction, a Z-axis movable member 86 supported by the X-axis movable member 84 movably in the Z-axis direction, and a Z-axis feeding mechanism (not illustrated) that moves the Z-axis movable member 86 in the Z-axis direction. The X-axis feeding mechanism of the frame conveying-out mechanism 68 may have a ball screw that is connected to the X-axis movable member 84 and that extends in the X-axis direction and a motor for rotating the ball screw, whereas the Z-axis feeding mechanism may have a ball screw that is connected to the Z-axis movable member 86 and that extends in the Z-axis direction and a motor for rotating the ball screw.

The Z-axis movable member 86 of the frame conveying-out mechanism 68 has a holding section 88 that holds the frame 64. The holding section 88 in the embodiment illustrated has a rectangular substrate 90 and a plurality of suction pads 92 provided on a lower surface of the substrate 90, with each suction pad 92 being connected to a suction source (not illustrated).

The frame conveying-out mechanism 68 suction-holds, by the suction pads 92 of the holding section 88, the uppermost frame 64 accommodated in the frame accommodating device 66 and thereafter moves the X-axis movable member 84 and the Z-axis movable member 86, whereby the uppermost frame 64 suction-held is conveyed out from the frame accommodating device 66.

As depicted in FIG. 5, the frame table 70 is supported by the Z-axis guide member 94 to be liftable up and down between a lowered position indicated by a solid line and a raised position indicated by an alternate long and short dashes line. An appropriate drive source (for example, an air drive source or an electric drive source) for lifting the frame table 70 up and down between the lowered position and the raised position is added to the Z-axis guide member 94. The frame table 70 is configured to receive, at the lowered position, the frame 64 conveyed out by the frame conveying-out mechanism 68.

As illustrated in FIGS. 1 and 5, the processing apparatus 2 includes a tape attaching mechanism 98 (see FIG. 1) that is disposed on an upper side of the frame table 70 and attaches a tape 96 to the frame 64, a tape-attached frame conveying mechanism 100 (see FIG. 5) that conveys the frame 64 with the tape 96 attached thereto (which may hereinafter be referred to as a "tape-attached frame 64'") to the wafer table 12 and mounts the tape-attached frame 64' on the wafer table 12 with the opening 64a of the frame 64 positioned at the back surface 4b of the wafer 4 supported by the wafer table 12, and a tape pressure bonding mechanism 102 (see FIG. 1) that pressure bonds the tape 96 of the tape-attached frame 64' to the back surface 4b of the wafer 4.

Figure 6A:
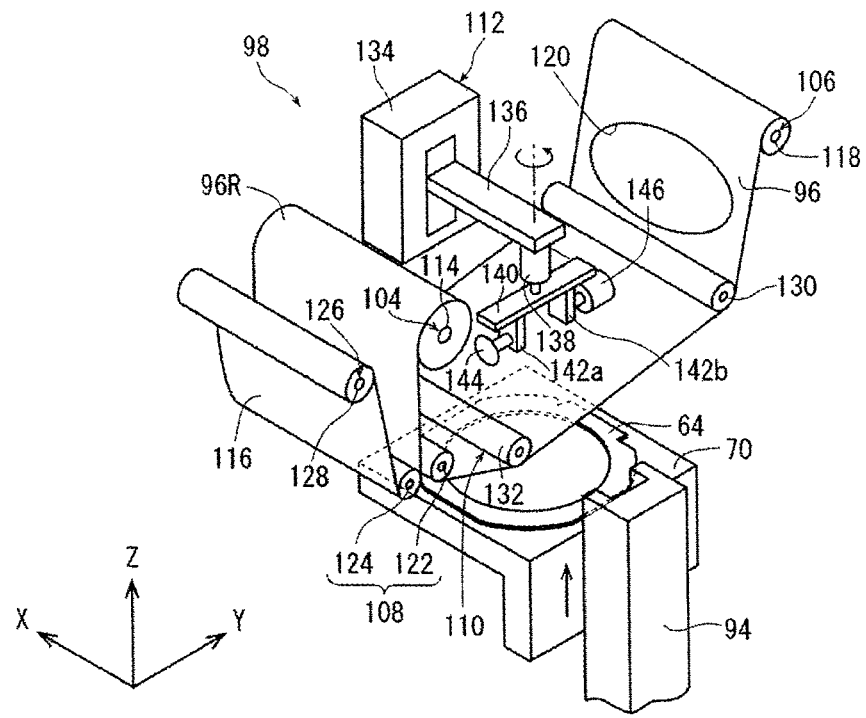
Figure 6B:
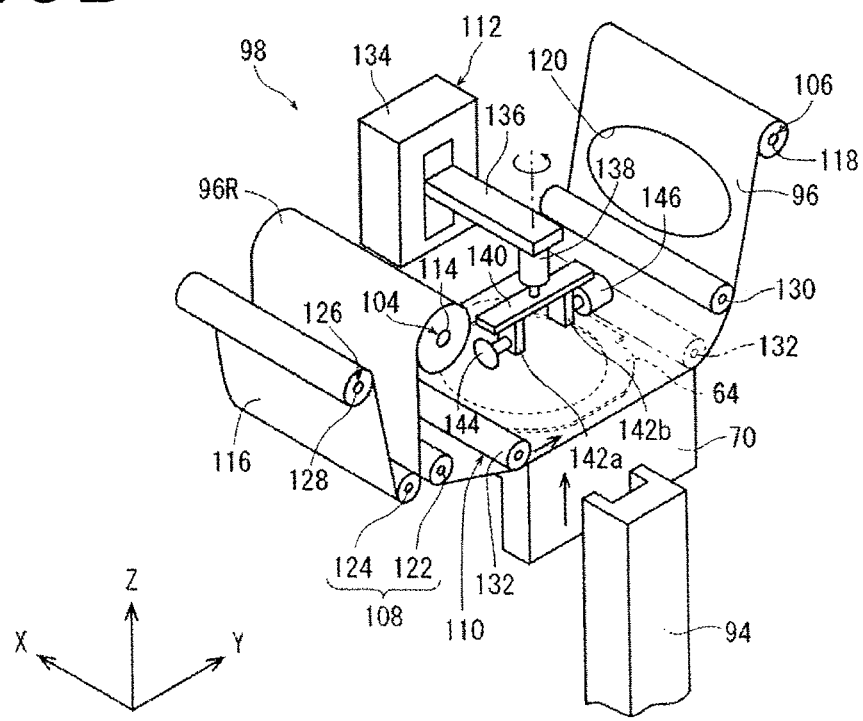

Referring to FIGS. 6A and 6B for description, the tape attaching mechanism 98 in the embodiment illustrated includes a roll tape support section 104 that supports a roll tape 96R in which the tape 96 before use is rolled, a tape take-up section 106 that takes up the used tape 96, a tape drawing section 108 that draws out the tape 96 from the roll tape 96R, a pressure bonding section 110 that pressure bonds the drawn out tape 96 to the frame 64, and a cutting section 112 that cuts the tape 96 protruding to the periphery of the frame 64, along the frame 64.

As depicted in FIGS. 6A and 6B, the roll tape support section 104 includes a support roller 114 supported by an appropriate bracket (not illustrated) such as to be rotatable around an axis extending in the X-axis direction. The roll tape 96R rolled in a cylindrical form with a release paper 116 for protecting the adhesive surface of the tape 96 attached to the adhesive surface of the tape 96 is supported by the support roller 114.

The tape take-up section 106 includes a take-up roller 118 supported by an appropriate bracket (not illustrated) such as to be rotatable around an axis extending in the X-axis direction; and a motor (not illustrated) for rotating the take-up roller 118. As depicted in FIGS. 6A and 6B, the tape take-up section 106 rotates the take-up roller 118 by the motor, to thereby take up the used tape 96 formed with a circular opening 120 corresponding to the part which has been attached to the frame 64.

Referring to FIGS. 6A and 6B for continuing description, the tape drawing section 108 includes a drawing roller 122 disposed on a lower side of the support roller 114 of the roll tape support section 104, a motor (not illustrated) for rotating the drawing roller 122, and a driven roller 124 rotated attendant on the rotation of the drawing roller 122. The tape drawing section 108 rotates the drawing roller 122 together with the driven roller 124 by the motor, whereby the tape 96 clamped between the drawing roller 122 and the driven roller 124 is drawn out from the roll tape 96R.

The release paper 116 is peeled off from the tape 96 passed between the drawing roller 122 and the driven roller 124, and the release paper 116 peeled off is taken up by a release paper take-up section 126. The release paper take-up section 126 in the embodiment illustrated has a release paper take-up roller 128 disposed on an upper side of the driven roller 124; and a motor (not illustrated) for rotating the release paper take-up roller 128. In addition, the tape 96 with the release paper 116 peeled off therefrom is passed through a guide roller 130 disposed with a spacing in the Y-axis direction from the drawing roller 122, to be guided to the take-up roller 118.

The pressure bonding section 110 includes a pressing roller 132 disposed movably in the Y-axis direction and a Y-axis feeding mechanism (not illustrated) that moves the pressing roller 132 in the Y-axis direction. The Y-axis feeding mechanism of the pressure bonding section 110 may include an appropriate drive source (for example, an air drive source or an electric drive source).

As depicted in FIGS. 6A and 6B, the cutting section 112 includes a Z-axis guide member 134 that is fixed to an appropriate bracket (not illustrated) and that extends in the Z-axis direction, a Z-axis movable member 136 supported by the Z-axis guide member 134 movably in the Z-axis direction, and a Z-axis feeding mechanism (not illustrated) that moves the Z-axis movable member 136 in the Z-axis direction. The Z-axis feeding mechanism of the cutting section 112 may have a ball screw that is connected to the Z-axis movable member 136 and that extends in the Z-axis direction and a motor for rotating the ball screw.

In addition, the cutting section 112 includes a motor 138 fixed to a lower surface of a tip of the Z-axis movable member 136 and an arm piece 140 rotated around an axis extending in the Z-axis direction by the motor 138. First and second hanging pieces 142a and 142b are added, with a spacing therebetween, to a lower surface of the arm piece 140. A circular cutter 144 is supported on the first hanging piece 142a rotatably around an axis orthogonal to the Z-axis direction, whereas a presser roller 146 is supported on the second hanging piece 142b rotatably around an axis orthogonal to the Z-axis direction.

Before the frame table 70 having received the frame 64 from the frame conveying-out mechanism 68 is positioned from the lowered position (the position depicted in FIG. 6A) to the raised position (the position depicted in FIG. 6B), the tape attaching mechanism 98 draws out the unused tape 96 by the drawing roller 122 and the driven roller 124. Then, the frame table 70 is positioned at the raised position to such an extent that the tape 96 can be pressed against the frame 64 by the pressing roller 132 of the pressure bonding section 110 and the frame 64 is brought into contact with the pressing roller 132 through the tape 96. Then, while pressing the adhesive surface of the tape 96 against the frame 64, the pressing roller 132 is rolled in the Y-axis direction. As a result, the tape 96 drawn out from the roll tape 96R by the tape drawing section 108 can be pressure bonded to the frame 64.

After the tape 96 is pressure bonded to the frame 64, the tape attaching mechanism 98 lowers the Z-axis movable member 136 of the cutting section 112 by the Z-axis feeding mechanism, presses the cutter 144 against the tape 96 on the frame 64, and presses the frame 64 from above the tape 96 by the presser roller 146. Next, the arm piece 140 is rotated by the motor 138, and the cutter 144 and the presser roller 146 are moved such as to draw a circle along the frame 64. As a result, the tape 96 protruding to the periphery of the frame 64 can be cut along the frame 64. In addition, since the frame 64 is pressed from above the tape 96 by the presser roller 146, positional deviation of the frame 64 and the tape 96 during cutting of the tape 96 is prevented. Further, after the frame table 70 is lowered, the used tape 96 formed with the circular opening 120 corresponding to the part which has been attached to the frame 64 is taken up by the tape take-up section 106.

As depicted in FIG. 5, the tape-attached frame conveying mechanism 100 includes a Y-axis guide member 148 that is fixed to an appropriate bracket (not illustrated) and that extends in the Y-axis direction, a Y-axis movable member 150 supported by the Y-axis guide member 148 movably in the Y-axis direction, a Y-axis feeding mechanism (not illustrated) that moves the Y-axis movable member 150 in the Y-axis direction, a Z-axis movable member 152 supported by the Y-axis movable member 150 movably in the Z-axis direction, and a Z-axis feeding mechanism (not illustrated) that moves the Z-axis movable member 152 in the Z-axis direction. The Y-axis feeding mechanism of the tape-attached frame conveying mechanism 100 may have a ball screw that is connected to the Y-axis movable member 150 and that extends in the Y-axis direction and a motor for rotating the ball screw, whereas the Z-axis feeding mechanism may have a ball screw that is connected to the Z-axis movable member 152 and that extends in the Z-axis direction and a motor for rotating the ball screw.

The Z-axis movable member 152 of the tape-attached frame conveying mechanism 100 has a holding section 154 that holds the tape-attached frame 64'. The holding section 154 in the embodiment illustrated has a rectangular substrate 156 and a plurality of suction pads 158 provided on a lower surface of the substrate 156, each suction pad 158 being connected to a suction source (not illustrated).

The tape-attached frame conveying mechanism 100 suction-holds, by the suction pads 158 of the holding section 154, the upper surface of the tape-attached frame 64' supported by the frame table 70 in a state in which the adhesive surface of the tape 96 is directed upward, and moves the Y-axis movable member 150 and the Z-axis movable member 152, whereby the tape-attached frame 64' suction-held by the holding section 154 is conveyed from the frame table 70 to the wafer table 12, the opening 64a of the frame 64 is located close to the back surface 4b of the wafer 4 supported by the wafer table 12, and the tape-attached frame 64' is mounted on the wafer table 12.

Figure 7:
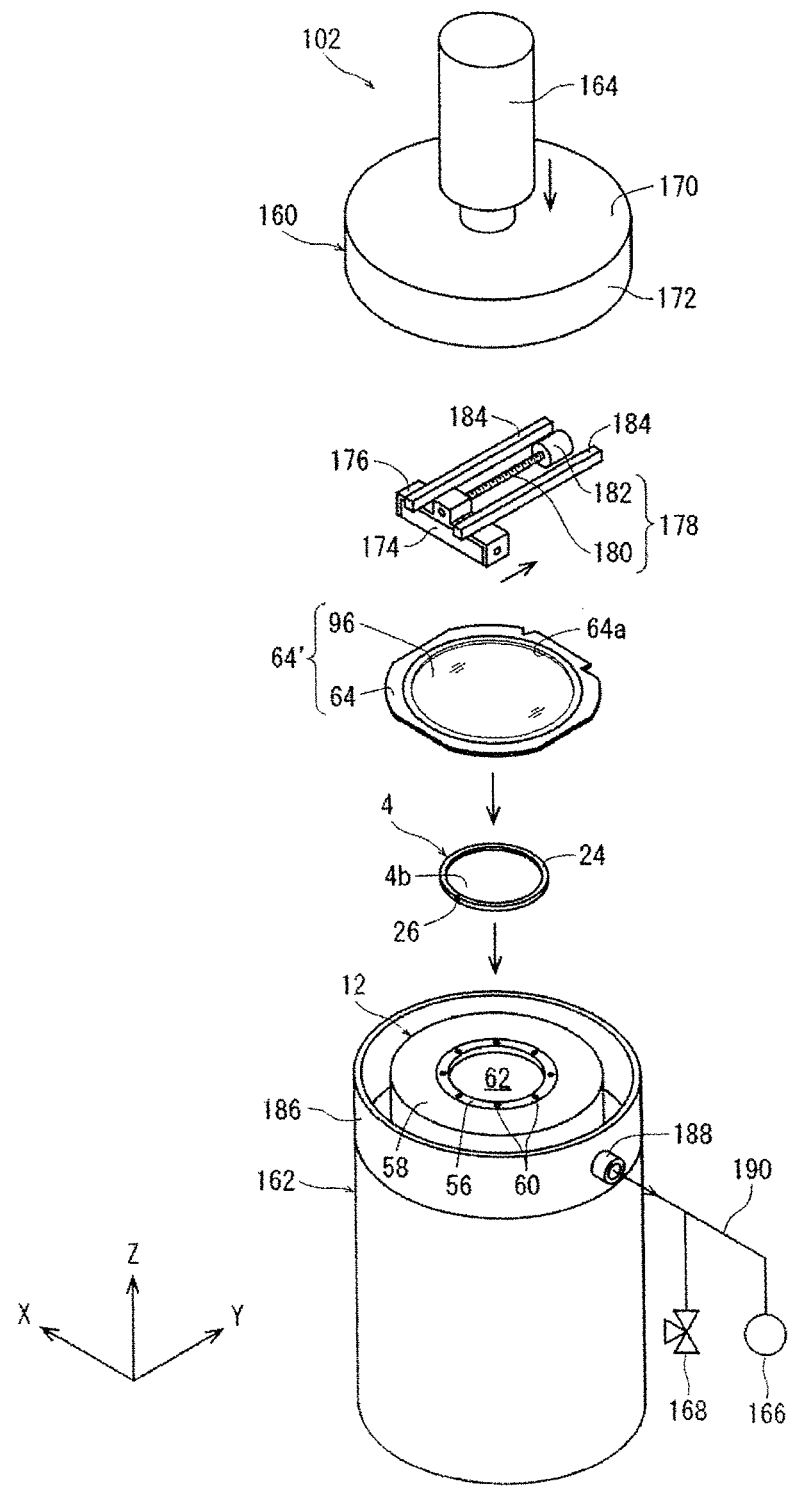
FIG. 7 is an exploded perspective view of a tape pressure bonding mechanism depicted in FIG. 1.
Figure 8:
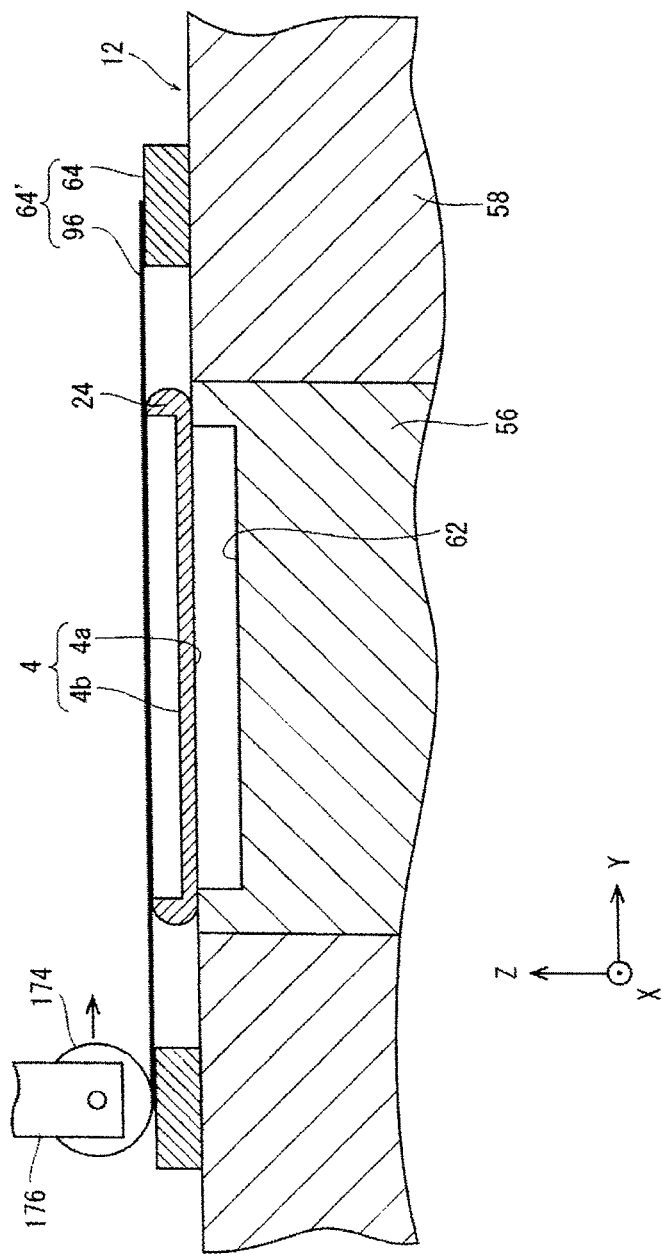
FIG. 8 is a sectional view depicting a state in which pressing of a tape by a pressing roller in a tape pressure bonding step is started.
Figure 9:
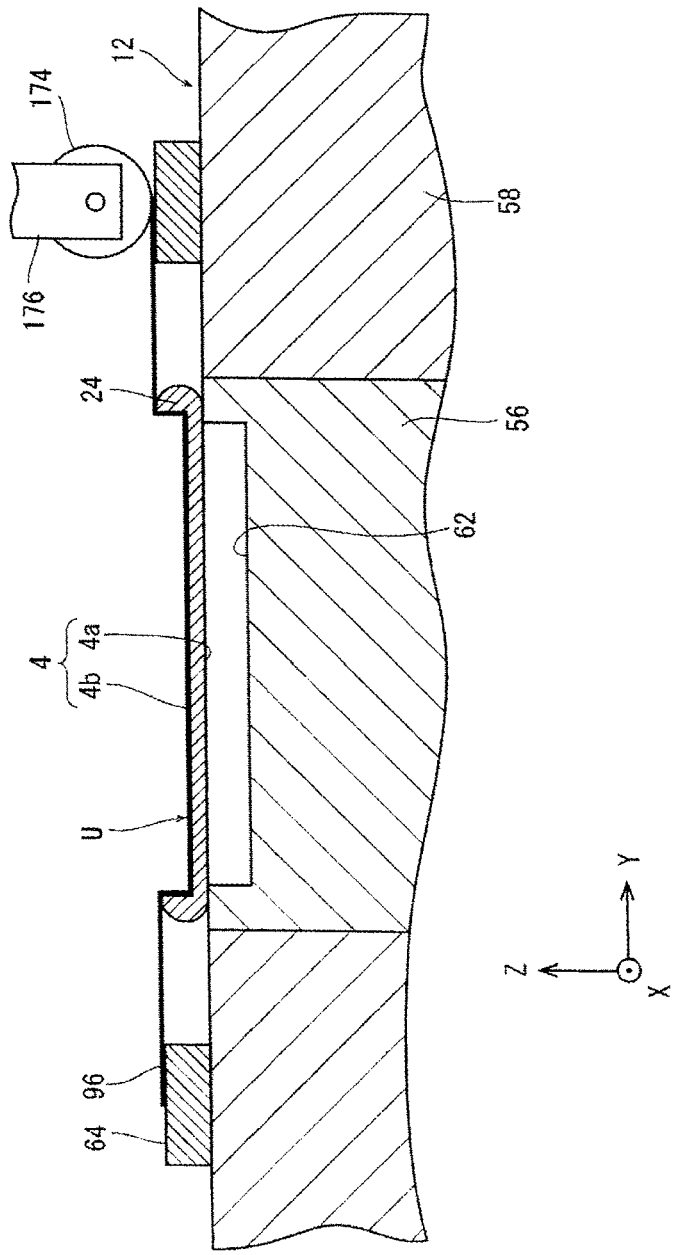
FIG. 9 is a sectional view depicting a state in which the pressing of the tape by the pressing roller in the tape pressure bonding step is finished.

Referring to FIGS. 7 to 9, the tape pressure bonding mechanism 102 will be described. As depicted in FIG. 7, the tape pressure bonding mechanism 102 includes an upper chamber 160 disposed on an upper side of the wafer table 12, a lower chamber 162 accommodating the wafer table 12, a lift mechanism 164 that moves up and down the upper chamber 160 to generate a closed state in which the upper chamber 160 makes contact with the lower chamber 162 and an open state in which the upper chamber 160 is spaced away from the lower chamber 162, a vacuum section 166 that establishes a vacuum in the upper chamber 160 and the lower chamber 162 in the closed state, and an atmospheric opening section 168 that opens the upper chamber 160 and the lower chamber 162 to the atmosphere.

As depicted in FIG. 7, the upper chamber 160 in the embodiment illustrated includes a circular top plate 170 and a cylindrical side wall 172 hanging down from a peripheral edge of the top plate 170. The lift mechanism 164 which can include an appropriate actuator such as an air cylinder is mounted to an upper surface of the top plate 170. In an accommodating space defined by the lower surface of the top plate 170 and an inner circumferential surface of the side wall 172, a pressing roller 174 for pressing the tape 96 of the tape-attached frame 64' against the back surface 4b of the wafer 4 supported by the wafer table 12, a support piece 176 supporting the pressing roller 174 in a rotatable manner, and a Y-axis feeding mechanism 178 that moves the support piece 176 in the Y-axis direction are disposed.

The Y-axis feeding mechanism 178 includes a ball screw 180 that is connected to the support piece 176 and that extends in the Y-axis direction and a motor 182 for rotating the ball screw 180. In addition, the Y-axis feeding mechanism 178 converts a rotational motion of the motor 182 into a rectilinear motion and transmits the rectilinear motion to the support piece 176 by the ball screw 180, to move the support piece 176 along a pair of guide rails 184 extending in the Y-axis direction.

As depicted in FIG. 7, the lower chamber 162 has a cylindrical side wall 186, an upper portion of the side wall 186 is opened, and a lower portion of the side wall 186 is closed. The side wall 186 is formed with a connection opening 188. A vacuum section 166 which can include an appropriate vacuum pump is connected to the connection opening 188 through a flow channel 190. The flow channel 190 is provided with the atmospheric opening section 168 which can include an appropriate valve capable of opening the flow channel 190 to the atmosphere.

The tape pressure bonding mechanism 102 lowers the upper chamber 160 by the lift mechanism 164 in a state in which the tape 96 of the tape-attached frame 64' is positioned on the back surface 4b of the wafer 4 supported by the wafer table 12, and brings a lower end of the side wall 172 of the upper chamber 160 into contact with an upper end of the side wall 186 of the lower chamber 162, to thereby bring the upper chamber 160 and the lower chamber 162 into the closed state and bring the pressing roller 174 into contact with the tape-attached frame 64'.

Next, the tape pressure bonding mechanism 102 operates the vacuum pump constituting the vacuum section 166 in a state in which the valve constituting the atmospheric opening section 168 is closed, to establish a vacuum in the inside of the upper chamber 160 and the lower chamber 162, and, as depicted in FIGS. 8 and 9, rolls the pressing roller 174 in the Y-axis direction by the Y-axis feeding mechanism 178, to thereby pressure bond the tape 96 to the back surface 4b of the wafer 4 and generate a frame unit U.

When the tape 96 is pressure bonded to the back surface 4b of the wafer 4 by the pressing roller 174, a slight gap is generated between the wafer 4 and the tape 96 at a base of the ring-shaped reinforcement section 24. Since the wafer 4 and the tape 96 are pressure bonded in a state in which a vacuum is established inside the upper chamber 160 and the lower chamber 162, however, the pressure inside the slight gap between the wafer 4 and the tape 96 is lower than the atmospheric pressure, so that when the atmospheric opening section 168 is opened after the tape 96 is pressure bonded, the tape 96 is pressed against the wafer 4 by the atmospheric pressure. As a result, the gap between the wafer 4 and the tape 96 at the base of the reinforcement section 24 is eliminated, and the tape 96 makes close contact with the back surface 4b of the wafer 4 along the base of the reinforcement section 24.

Figure 10:
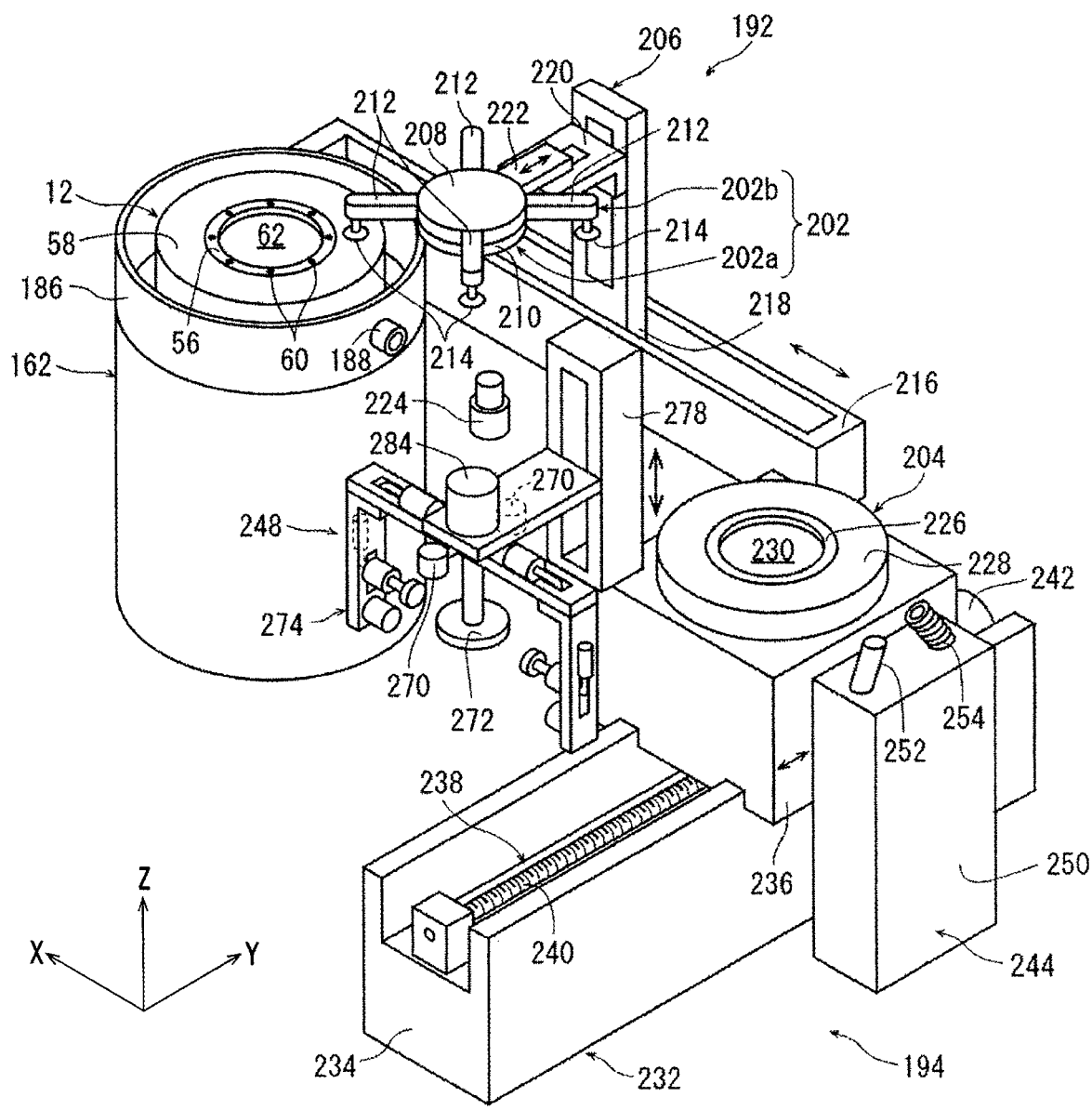
FIG. 10 is a perspective view of a reinforcement section removing mechanism depicted in FIG. 1.

As depicted in FIGS. 1 and 10, the processing apparatus 2 further includes a frame unit conveying-out mechanism 192 that conveys out, from the wafer table 12, the frame unit U in which the tape 96 of the tape-attached frame 64' and the back surface 4b of the wafer 4 have been pressure bonded by the tape pressure bonding mechanism 102, a reinforcement section removing mechanism 194 that cuts and removes the ring-shaped reinforcement section 24 from the wafer 4 of the frame unit U conveyed out by the frame unit conveying-out mechanism 192, a ringless unit conveying-out mechanism 196 (see FIG. 1) that conveys out, from the reinforcement section removing mechanism 194, a ringless unit U' from which the ring-shaped reinforcement section 24 has been removed, and a frame cassette table 200 (see FIG. 1) on which the frame cassette 198 accommodating the ringless unit U' conveyed out by the ringless unit conveying-out mechanism 196 is to be mounted.

As depicted in FIG. 10, the frame unit conveying-out mechanism 192 in the embodiment illustrated includes a frame unit holding section 202 including a wafer holding section 202a for holding the wafer 4 and a frame holding section 202b for holding the frame 64; and a conveying section 206 that conveys the frame unit holding section 202 onto a temporary placing table 204.

The wafer holding section 202a of the frame unit holding section 202 includes a circular substrate 208 and a circular suction piece 210 mounted to a lower surface of the substrate 208. A lower surface of the suction piece 210 is formed with a plurality of suction holes (not illustrated), and each suction hole is connected to a suction source (not illustrated). The frame holding section 202b includes a plurality of (in the embodiment illustrated, four) projection pieces 212 projecting to the radial directionally outer side from a peripheral edge of the substrate 208 of the wafer holding section 202a at intervals in the circumferential direction and suction pads 214 added to lower surfaces of the projection pieces 212, each suction pad 214 being connected to a suction source (not illustrated).

The conveying section 206 includes an X-axis guide member 216 that is fixed to an appropriate bracket (not illustrated) and that extends in the X-axis direction, an X-axis movable member 218 supported by the X-axis guide member 216 movably in the X-axis direction, an X-axis feeding mechanism (not illustrated) that moves the X-axis movable member 218 in the X-axis direction, a Z-axis movable member 220 supported by the X-axis movable member 218 movably in the Z-axis direction, a Z-axis feeding mechanism (not illustrated) that moves the Z-axis movable member 220 in the Z-axis direction, a Y-axis movable member 222 supported by the Z-axis movable member 220 movably in the Y-axis direction, and a Y-axis feeding mechanism (not illustrated) that moves the Y-axis movable member 222 in the Y-axis direction. The substrate 208 of the wafer holding section 202a is connected to a tip of the Y-axis movable member 222. Each of the X-axis, Y-axis, and Z-axis feeding mechanisms of the conveying section 206 may have a ball screw and a motor for rotating the ball screw.

The frame unit conveying-out mechanism 192 preferably includes a two-dimensional moving mechanism that moves the frame unit holding section 202 on a two-dimensional basis in horizontal directions and an imaging section 224 that images the periphery of the wafer 4 of the frame unit U held by the frame unit holding section 202; in the embodiment illustrated, the frame unit holding section 202 is moved on a two-dimensional basis in horizontal directions in an XY plane by the X-axis feeding mechanism and the Y-axis feeding mechanism of the conveying section 206, and the conveying section 206 constitutes a two-dimensional moving mechanism. In addition, the imaging section 224 in the embodiment illustrated is disposed between the wafer table 12 and the temporary placing table 204, and images the periphery of the wafer 4 of the frame unit U held by the frame unit holding section 202, from below the wafer 4.

In a state in which the wafer 4 is suction-held from the back surface 4b side (the tape 96 side) by the suction piece 210 of the wafer holding section 202a and in which the frame 64 is suction-held by the suction pads 214 of the frame holding section 202b, the frame unit conveying-out mechanism 192, operates the conveying section 206, whereby the frame unit U held by the frame unit holding section 202 is conveyed out from the wafer table 12.

In addition, the frame unit conveying-out mechanism 192 in the embodiment illustrated operates the conveying section 206 constituting the two-dimensional moving mechanism, and at least three parts of the periphery of the wafer 4 of the frame unit U held by the frame unit holding section 202 are imaged by the imaging section 224, whereby the coordinates of the at least three parts of the periphery of the wafer 4 are measured, and the coordinates of the center of the wafer 4 are obtained based on the coordinates of the three parts measured. Then, the frame unit conveying-out mechanism 192 temporarily places the frame unit U on the temporary placing table 204, with the center of the wafer 4 coincident with the center of the temporary placing table 204.

As depicted in FIG. 10, the temporary placing table 204 is disposed with a spacing from the wafer table 12 in the X-axis direction. The temporary placing table 204 in the embodiment illustrated includes an annular support section 226 that supports the peripheral marginal area 20 of the wafer 4 of the frame unit U while putting the part on the inner side than the peripheral marginal area 20 in a non-contact state; and a frame support section 228 that is disposed at the periphery of the annular support section 226 and supports the frame 64.

The part on the radial directionally inner side than the annular support section 226 is a downwardly hollowed circular recess 230. It is preferable that the frame support section 228 of the temporary placing table 204 include a heater (not illustrated), and that, by heating the tape 96 of the frame unit U temporarily placed on the temporary placing table 204 by the heater to soften the tape 96, the tape 96 be put into further close contact with the base of the ring-shaped reinforcement section 24 by the atmospheric pressure.

The processing apparatus 2 in the embodiment illustrated includes a temporary placing table conveying section 232 that conveys the temporary placing table 204 in the Y-axis direction. The temporary placing table conveying section 232 includes a Y-axis guide member 234 extending in the Y-axis direction, a Y-axis movable member 236 supported by the Y-axis guide member 234 movably in the Y-axis direction, and a Y-axis feeding mechanism 238 that moves the Y-axis movable member 236 in the Y-axis direction. The temporary placing table 204 is fixed to an upper portion of the Y-axis movable member 236. The Y-axis feeding mechanism 238 includes a ball screw 240 that is connected to the Y-axis movable member 236 and that extends in the Y-axis direction and a motor 242 for rotating the ball screw 240. Further, the temporary placing table conveying section 232 converts a rotational motion of the motor 242 into a rectilinear motion and transmits the rectilinear motion to the Y-axis movable member 236 by the ball screw 240, to convey the temporary placing table 204 together with the Y-axis movable member 236 in the Y-axis direction.

As depicted in FIGS. 1 and 10, the reinforcement section removing mechanism 194 includes a laser beam applying unit 244 that applies a laser beam toward a base of the ring-shaped reinforcement section 24 formed at the periphery of the wafer 4 and forms a cut groove, a first lift table 246 (see FIG. 1) that holds and raises the frame unit U temporarily placed on the temporary placing table 204 and moves the frame unit U in the X-axis direction to position the frame unit U at the laser beam applying unit 244, and a separating section 248 that separates the ring-shaped reinforcement section 24 from the cut groove.

As depicted in FIG. 10, the laser beam applying unit 244 includes a housing 250 disposed adjacent to the temporary placing table 204 in the X-axis direction, a laser oscillator (not illustrated) that is accommodated in the housing 250 and oscillates a laser, a light concentrator 252 that concentrates the laser beam generated by laser oscillation by the laser oscillator and applies the laser beam to a base of the ring-shaped reinforcement section 24 formed at the periphery of the wafer 4, a suction nozzle 254 which sucks debris generated when the laser beam is applied to the wafer 4, and a suction source (not illustrated) connected to the suction nozzle 254.

The light concentrator 252 extends from an upper surface of the housing 250 toward an upper side while inclining to the suction nozzle 254 side, whereby the debris generated when the laser beam is applied is restrained from falling onto the light concentrator 252. In addition, the suction nozzle 254 extends from an upper surface of the housing 250 toward an upper side while inclining to the light concentrator 252 side.

Figure 11:
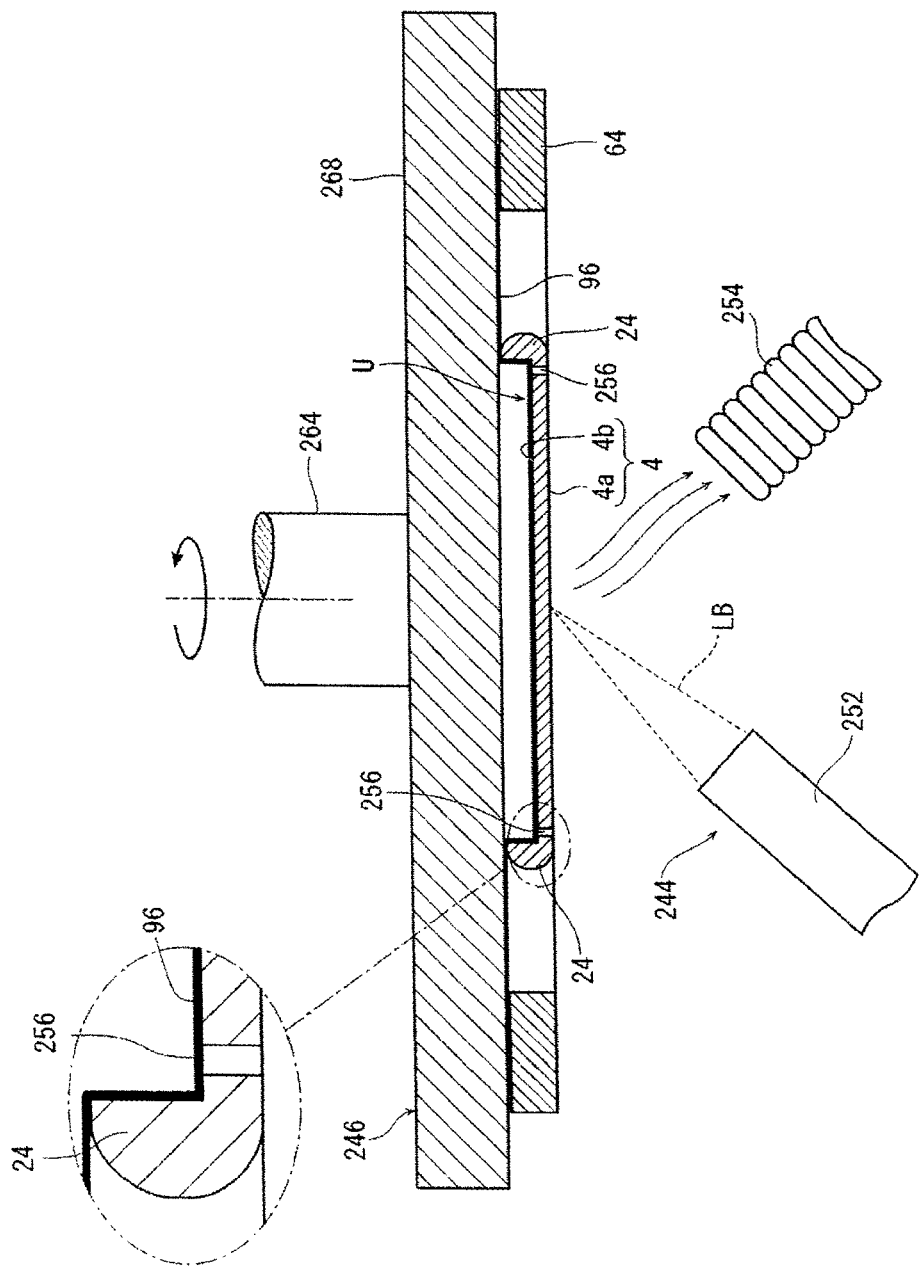
FIG. 11 is a schematic diagram depicting a state in which a laser beam is applied to a base of a wafer in a reinforcement section removing step.

As depicted in FIG. 11, the laser beam applying unit 244 applies a laser beam LB toward the base of the ring-shaped reinforcement section 24 formed at the periphery of the wafer 4, while the frame unit U held by the first lift table 246 is rotated, and forms a ring-shaped cut groove 256 along the base of the reinforcement section 24 by ablation. In addition, the laser beam applying unit 244 sucks the debris generated by ablation by the suction nozzle 254.

Figure 12:
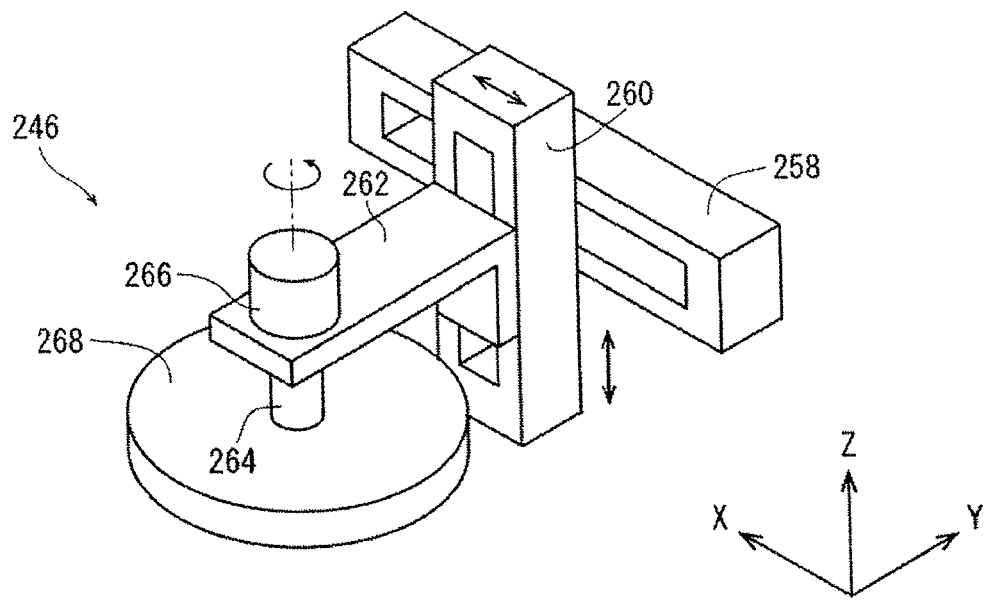
FIG. 12 is a perspective view of a first lift table of the reinforcement section removing mechanism depicted in FIG. 1.

As depicted in FIG. 1, the first lift table 246 is disposed movably in the X-axis direction and movably in the Z-axis direction on an upper side of the temporary placing table 204. Referring to FIG. 12 for description, the first lift table 246 includes an X-axis guide member 258 that is fixed to an appropriate bracket (not illustrated) and that extends in the X-axis direction, an X-axis movable member 260 supported by the X-axis guide member 258 movably in the X-axis direction, an X-axis feeding mechanism (not illustrated) that moves the X-axis movable member 260 in the X-axis direction, a Z-axis movable member 262 supported by the X-axis movable member 260 movably in the Z-axis direction, and a Z-axis feeding mechanism (not illustrated) that moves the Z-axis movable member 262 in the Z-axis direction. Each of the X-axis and Z-axis feeding mechanisms of the first lift table 246 may have a ball screw and a motor for rotating the ball screw.

A support shaft 264 extending downward is rotatably supported on a lower surface of a tip of the Z-axis movable member 262, and a motor 266 for rotating the support shaft 264 around an axis extending in the Z-axis direction is attached to an upper surface of the tip of the Z-axis movable member 262. A circular suction piece 268 is fixed to a lower end of the support shaft 264. A lower surface of the suction piece 268 is formed with a plurality of suction holes (not illustrated) on a circular circumference corresponding to the size of the frame 64 at intervals in the circumferential direction, and each of the suction holes is connected to a suction source.

The first lift table 246 moves the Z-axis movable member 262 and the X-axis movable member 260, after the tape 96 is heated by a heater of the frame support section 228 of the temporary placing table 204 and a frame 64 part of the frame unit U with the tape 96 in close contact with a base of the ring-shaped reinforcement section 24 is suction-held by the suction piece 268, and raises the frame unit U suction-held by the suction piece 268 and moves the frame unit U in the X-axis direction, thereby positioning the frame unit U at the laser beam applying unit 244. Note that, in the case where the frame 64 is made of a magnetic material, an electromagnet (not illustrated) may be added to the lower surface of the suction piece 268, and the frame 64 may be attracted by the magnetic force of the suction piece 268.

In addition, the first lift table 246 operates the motor 266 when the laser beam LB is applied to the wafer 4 by the laser beam applying unit 244, and rotates the frame unit U suction-held by the suction piece 268. Further, the first lift table 246 moves the frame unit U with the cut groove 256 formed at the base of the reinforcement section 24, in the X-axis direction and the Z-axis direction to temporarily place the frame unit U on the temporary placing table 204.

Figure 13:
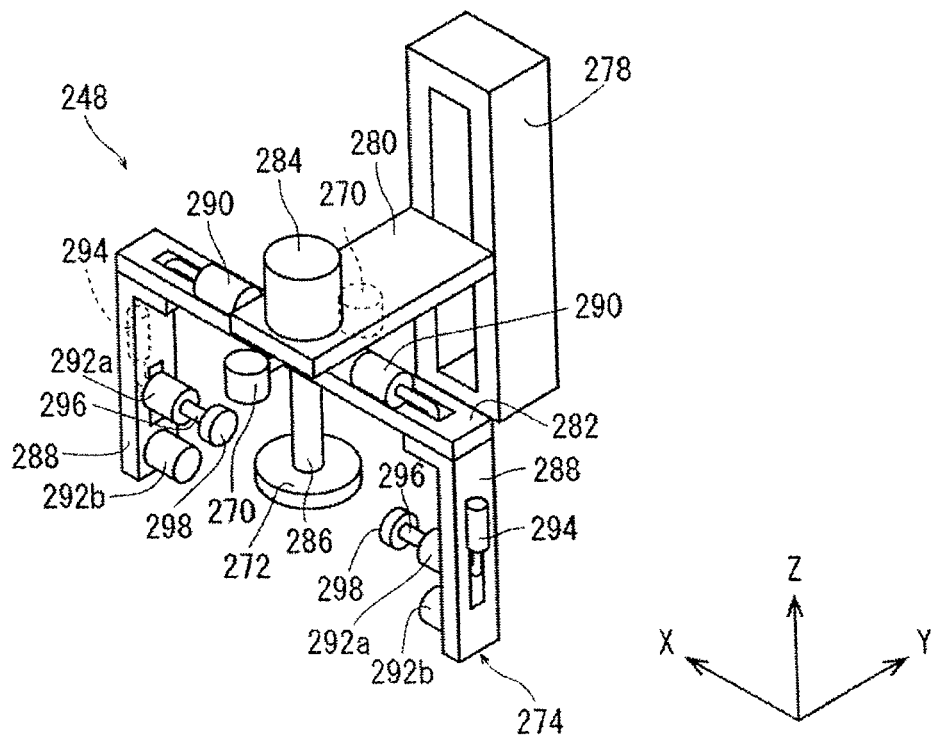
FIG. 13 is a perspective view of a separating section of the reinforcement section removing mechanism depicted in FIG. 1.
Figure 15:
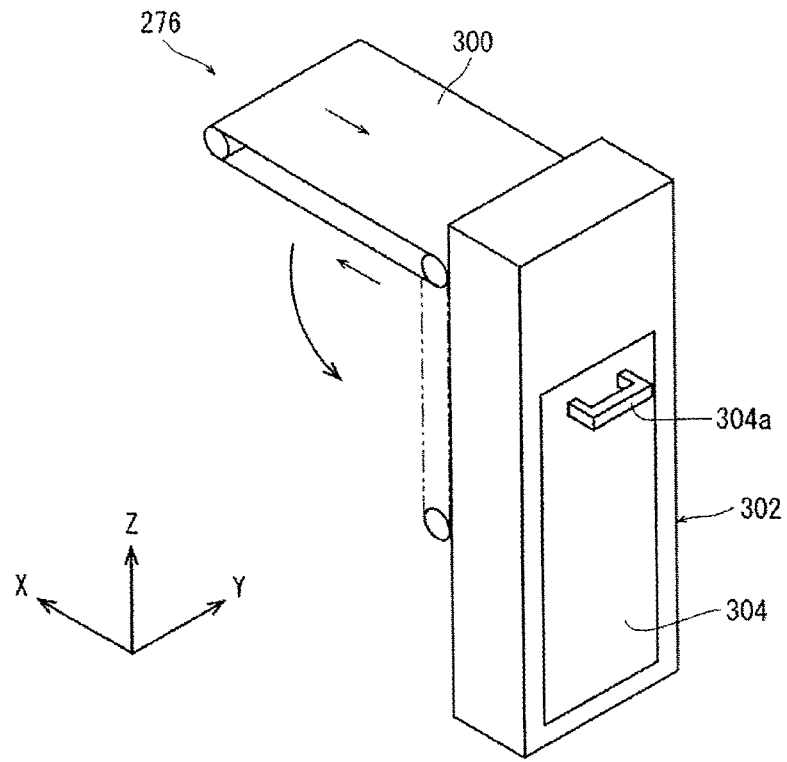
FIG. 15 is a perspective view of a discarding section of the reinforcement section removing mechanism depicted in FIG. 1.

As depicted in FIG. 1, the separating section 248 is disposed with a spacing from the first lift table 246 in the Y-axis direction within a movable range in the Y-axis direction of the temporary placing table 204. Referring to FIGS. 13 and 15 for description, the separating section 248 includes an ultraviolet ray applying section 270 (see FIG. 13) that applies ultraviolet rays to the tape 96 corresponding to the cut groove 256 to reduce the adhesive force of the tape 96, a second lift table 272 (see FIG. 13) that suction-holds the inside of the wafer 4, with the ring-shaped reinforcement section 24 exposed on the periphery, and supports the frame 64, a separator 274 (see FIG. 13) that acts on the periphery of the ring-shaped reinforcement section 24 to separate the ring-shaped reinforcement section 24, and a discarding section 276 (see FIG. 15) where the separated ring-shaped reinforcement section 24 is discarded.

As depicted in FIG. 13, the separating section 248 in the embodiment illustrated includes a Z-axis guide member 278 that is fixed to an appropriate bracket (not illustrated) and that extends in the Z-axis direction, a Z-axis movable member 280 supported on the Z-axis guide member 278 movably in the Z-axis direction, and a Z-axis feeding mechanism (not illustrated) that moves the Z-axis movable member 280 in the Z-axis direction. The Z-axis feeding mechanism may have a ball screw that is connected to the Z-axis movable member 280 and that extends in the Z-axis direction and a motor for rotating the ball screw.

On a lower surface of a tip of the Z-axis movable member 280, the support piece 282 is supported, the support shaft 286 is rotatably supported, and the second lift table 272 is connected to the support shaft 286. To an upper surface of the tip of the Z-axis movable member 280, a motor 284 for rotating the second lift table 272 together with the support shaft 286 is attached. To the support piece 282 in the embodiment illustrated, a pair of the ultraviolet ray applying sections 270 are added, with a spacing therebetween in the Y-axis direction.

The second lift table 272 is circular in shape, and the diameter of the second lift table 272 is slightly smaller than the diameter of the device area 18 (the part on the inner side than the ring-shaped reinforcement section 24) of the wafer 4. A lower surface of the second lift table 272 is formed with a plurality of suction holes (not illustrated), and each of the suction holes is connected to a suction source.

In addition, the separator 274 is mounted to the support piece 282. The separator 274 includes a pair of movable pieces 288 disposed on a lower surface of the support piece 282 with a spacing therebetween and in a movable manner in the longitudinal direction of the support piece 282; and a pair of feeding mechanisms 290 that move the pair of movable pieces 288. Each of the pair of feeding mechanisms 290 may include an appropriate actuator such as an air cylinder and an electric cylinder.

The separator 274 includes a pair of clamping rollers 292*a* and 292*b* supported on the movable pieces 288 with a vertical spacing therebetween, and a Z-axis feeding mechanism 294 that moves the clamping roller 292*a* on the upper side in the Z-axis direction. The Z-axis feeding mechanism 294 may include an appropriate actuator such as an air cylinder and an electric cylinder. Each of the clamping rollers 292*a* and 292*b* is supported by the movable piece 288 rotatably around an axis extending in the Y-axis direction. A pressing roller 298 is mounted to the clamping roller 292*a* on the upper side through a support shaft 296.

Referring to FIG. 15 for description, the discarding section 276 includes a belt conveyor 300 that conveys the separated ring-shaped reinforcement section 24 and a dust box 302 that accommodates the ring-shaped reinforcement section 24 conveyed by the belt conveyor 300. The belt conveyor 300 is positioned by an appropriate actuator (not illustrated) to a recovery position (the position indicated by a solid line in FIG. 15) that extends substantially horizontally and a standby position (the position indicated by an alternate long and short dashes line in FIG. 15) that extends substantially vertically. A door 304 with a handle 304*a* added thereto is provided at a side surface on the X-axis directionally viewer's side of the dust box 302 in FIG. 15. A pulverizer (not illustrated) for pulverizing the recovered ring-shaped reinforcement section 24 is attached inside the dust box 302. The dust box 302 is configured such that, by grasping the handle 304*a* and opening the door 304, the pulverization debris of the ring-shaped reinforcement section 24 accommodated in the dust box 302 can be taken out.

Figure 14:
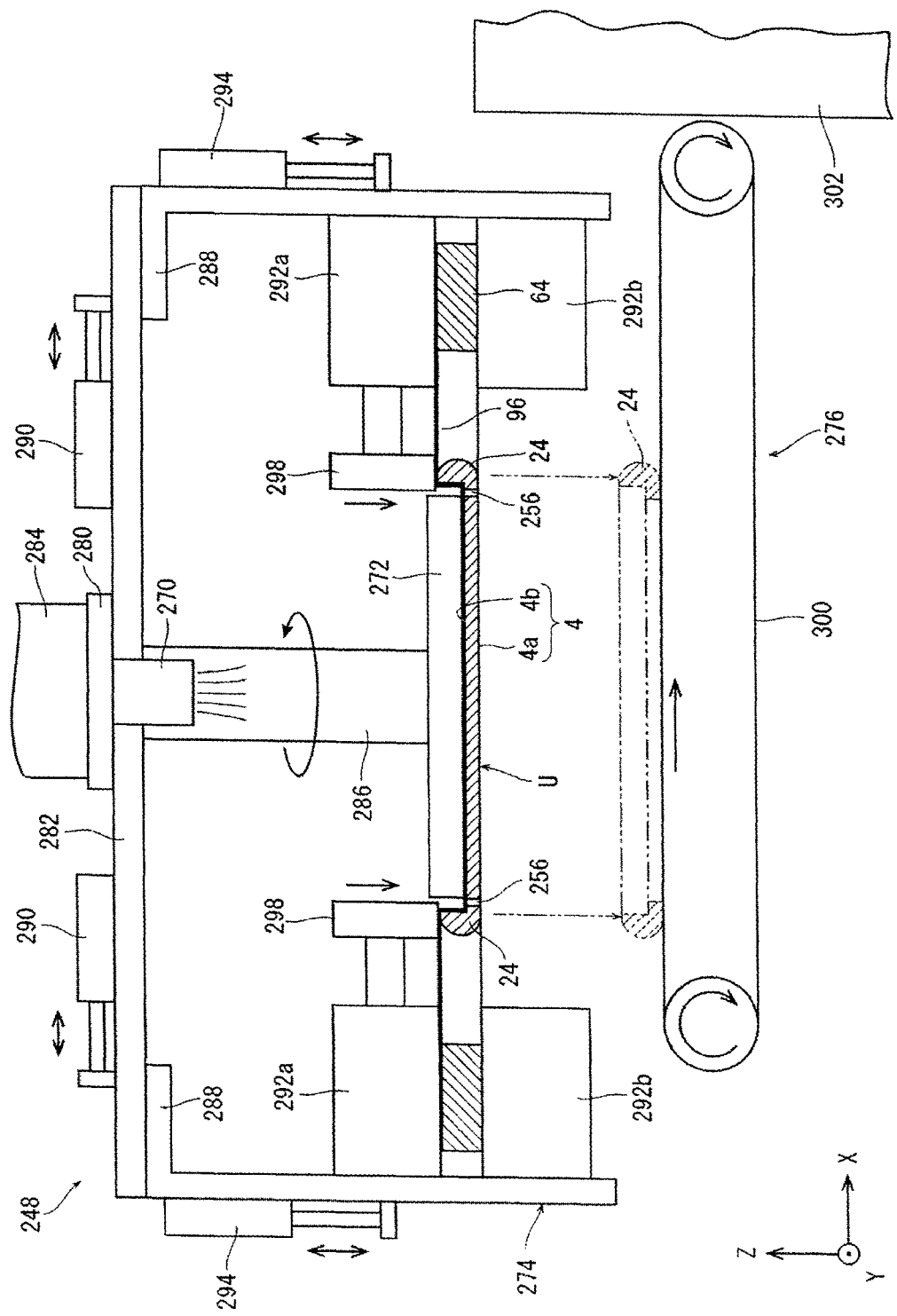
FIG. 14 is a schematic diagram depicting a state in which a reinforcement section is separated from the wafer in the reinforcement section removing step.

When the temporary placing table 204 on which the frame unit U with the cut groove 256 formed at the base of the reinforcement section 24 is temporarily placed is positioned on a lower side of the separating section 248 by the temporary placing table conveying section 232, the separating section 248 suction-holds the back surface 4*b* side of the wafer 4 of the frame unit U by the second lift table 272 and clamps the frame 64 by the clamping rollers 292*a* and 292*b* of the separator 274, as depicted in FIG. 14. Thereafter, ultraviolet rays are applied from the pair of ultraviolet ray applying sections 270 to reduce the adhesive force of the tape 96 attached to the ring-shaped reinforcement section 24, and, while the ring-shaped reinforcement section 24 is pressed downward by the pressing roller 298, the frame unit U is rotated together with the support shaft 286 and the second lift table 272 by the motor 284 relative to the separator 274, whereby the ring-shaped reinforcement section 24 is separated from the frame unit U. The reinforcement section 24 thus separated is conveyed to and recovered by the dust box 302 by the belt conveyor 300. Note that, when separating the reinforcement section 24, the separator 274 may be rotated relative to the frame unit U.

Figure 16:
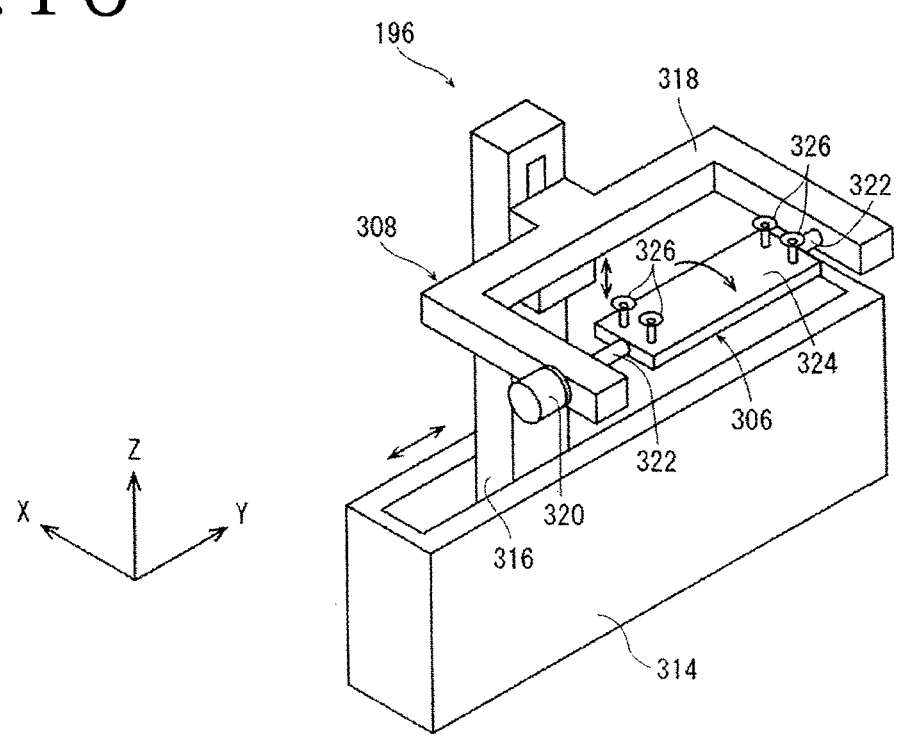
FIG. 16 is a perspective view of a reversing mechanism of a ringless unit conveying-out mechanism depicted in FIG. 1.
Figure 17:
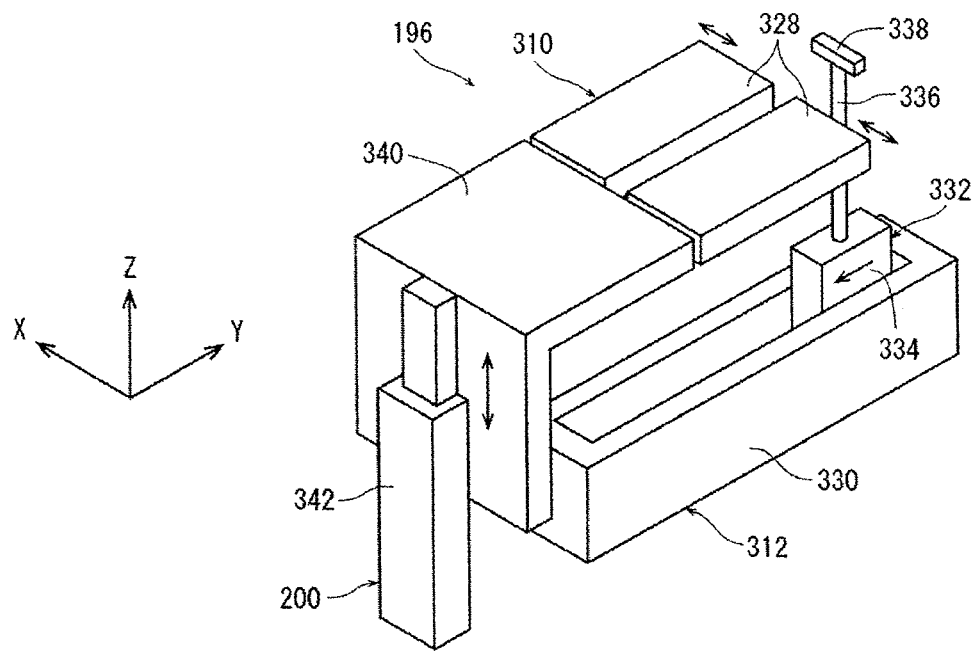
FIG. 17 is a perspective view of a ringless unit support section and a pushing-in section of the ringless unit conveying-out mechanism depicted in FIG. 1.

As depicted in FIG. 1, the ringless unit conveying-out mechanism 196 is disposed adjacent to the reinforcement section removing mechanism 194. Referring to FIGS. 16 and 17 for description, the ringless unit conveying-out mechanism 196 in the embodiment illustrated includes a reversing mechanism 308 (see FIG. 16) that includes a frame holding section 306 facing the ringless unit U' supported by the second lift table 272 and holding the frame 64, moves toward the frame cassette table 200, and reverses the frame holding section 306, a ringless unit support section 310 (see FIG. 17) that is reversed by the reversing mechanism 308 and supports the ringless unit U' with the front surface 4a of the wafer 4 directed upward, and a pushing-in section 312 (see FIG. 17) that causes the ringless unit U' supported by the ringless unit support section 310 to enter and to be accommodated in the frame cassette 198 mounted on the frame cassette table 200.

As depicted in FIG. 16, the reversing mechanism 308 includes a Y-axis guide member 314 extending in the Y-axis direction, a Y-axis movable member 316 supported by the Y-axis guide member 314 movably in the Y-axis direction, a Y-axis feeding mechanism (not illustrated) that moves the Y-axis movable member 316 in the Y-axis direction, an arm 318 that is supported by the Y-axis movable member 316 movably in the Z-axis direction, and a Z-axis feeding mechanism (not illustrated) that moves the arm 318 in the Z-axis direction. Each of the Y-axis and Z-axis feeding mechanisms of the reversing mechanism 308 may have a ball screw and a motor for rotating the ball screw.

The frame holding section 306 is supported on the arm 318 such as to be reversible upside down, and a motor 320 that reverses the frame holding section 306 upside down is attached to the arm 318. The frame holding section 306 in the embodiment illustrated includes a substrate 324 supported by the arm 318 rotatably through a pair of rotary shafts 322; and a plurality of suction pads 326 added to one surface of the substrate 324, with each suction pad 326 being connected to a suction source (not illustrated). In addition, one of the rotary shafts 322 is connected to the motor 320.

In a state in which the suction pads 326 are directed upward, the reversing mechanism 308 suction-holds the lower surface of the frame 64 of the ringless unit U' supported by the second lift table 272 by the suction pads 326, and receives the ringless unit U' from the second lift table 272. In addition, after the frame holding section 306 is reversed by the motor 320 to direct the front surface 4a of the wafer 4 upward, the reversing mechanism 308 moves the Y-axis movable member 316, to thereby move the ringless unit U' held by the frame holding section 306 toward the frame cassette table 200.

As depicted in FIG. 17, the ringless unit support section 310 in the embodiment illustrated includes a pair of support plates 328 supported movably in the X-axis direction through appropriate brackets (not illustrated); and a gap adjusting mechanism (not illustrated) that adjusts the gap between the pair of support plates 328 in the X-axis direction. The gap adjusting mechanism may include an appropriate actuator such as an air cylinder or an electric cylinder.

A heater (not illustrated) is mounted to the pair of support plates 328 that support the ringless unit U'. In a state in which the spacing between the pair of support plates 328 is narrowed, the pair of support plates 328 heat the tape 96 of the ringless unit U' by the heater, whereby sag and wrinkles of the tape 96 generated by removal of the reinforcement section 24 are stretched.

Referring to FIG. 17 for continuing description, the pushing-in section 312 in the embodiment illustrated includes a Y-axis guide member 330 extending in the Y-axis direction, a Y-axis movable member 332 supported by the Y-axis guide member 330 movably in the Y-axis direction, and a Y-axis feeding mechanism (not illustrated) that moves the Y-axis movable member 332 in the Y-axis direction. The Y-axis movable member 332 includes a substrate 334 supported by the Y-axis guide member 330, a support column 336 extending upward from an upper surface of the substrate 334, and a pressing piece 338 added to an upper end of the support column 336. The Y-axis feeding mechanism of the pushing-in section 312 may have a ball screw that is connected to the Y-axis movable member 332 and that extends in the Y-axis direction and a motor for rotating the ball screw.

Figure 18:
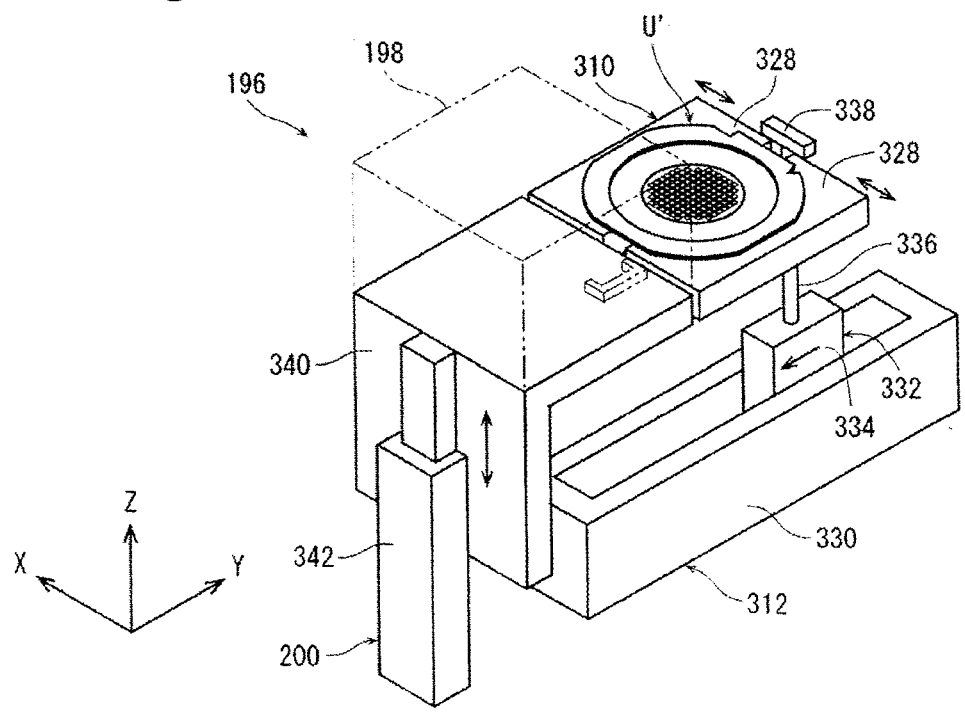
FIG. 18 is a perspective view depicting a state in which a ringless unit accommodating step is being carried out.

As depicted in FIG. 18, the ringless unit support section 310 widens the gap between the pair of support plates 328 by the gap adjusting mechanism before receiving the ringless unit U', and thereafter receives the ringless unit U' held by the suction pads 326. Then, the pushing-in section 312 moves the Y-axis movable member 332 in the Y-axis direction by the Y-axis feeding mechanism, whereby the ringless unit U' supported by the ringless unit support section 310 is caused, by the pressing piece 338, to enter and to be accommodated in the frame cassette 198 mounted on the frame cassette table 200.

In the frame cassette 198 depicted in FIGS. 1 and 18, a plurality of the ringless units U' in a state in which the front surfaces 4a of the wafers 4 are directed upward are accommodated at intervals in the vertical direction. As depicted in FIGS. 17 and 18, the frame cassette table 200 includes a mount section 340 on which the frame cassette 198 is to be mounted and a lifting section 342 that moves the mount section 340 up and down to position the mount section 340 at any height. The lifting section 342 may have a ball screw that is connected to the mount section 340 and that extends in the Z-axis direction and a motor for rotating the ball screw.

Next, a processing method of attaching a tape (dicing tape) 96 to the back surface 4b of the wafer 4 formed with the ring-shaped reinforcement section 24 in a projection form on the back surface 4b corresponding to the peripheral marginal area 20, to unite the tape 96 and the frame 64, and cutting the ring-shaped reinforcement section 24 to remove the reinforcement section 24 from the wafer 4, by use of the abovementioned processing apparatus 2, will be described.

In the embodiment illustrated, first, as depicted in FIGS. 1 and 3, a wafer cassette mounting step in which the wafer cassette 6 accommodating the plurality of wafers 4 is mounted on the wafer cassette table 8 is carried out. In the wafer cassette 6, the plurality of wafers 4 with the front surfaces 4a directed upward are accommodated at vertical intervals.

In addition, as depicted in FIGS. 1 and 5, a frame accommodating step of accommodating, in the frame accommodating device 66, a plurality of ring-shaped frames 64 each formed with the opening 64a for accommodating the wafer 4 is carried out. The frame accommodating step may be performed before the wafer cassette mounting step, or may be conducted after the wafer cassette mounting step.

In the frame accommodating step, the lift plate 74 of the frame accommodating device 66 is lowered to any position, after which the handle 76a is grasped and the door 76 is opened, and a plurality of frames 64 are stacked on an upper surface of the lift plate 74 and are accommodated. In addition, the height of the lift plate 74 is appropriately adjusted, to position the uppermost frame 64 at such a position that it can be conveyed out by the frame conveying-out mechanism 68.

After the wafer cassette mounting step and the frame accommodating step are performed, a wafer conveying-out step in which the wafer 4 is conveyed out from the wafer cassette 6 mounted on the wafer cassette table 8 is conducted.

Referring to FIG. 3 for description, in the wafer conveying-out step, first, the Y-axis feeding mechanism 34 of the wafer conveying-out mechanism 10 is operated, to position the Y-axis movable member 32 in the vicinity of the wafer cassette table 8. Next, the conveying arm 42 is operated, and the hand 44 with the air jet ports 46 directed upward is positioned on the back surface 4b side (lower side) of the wafer 4 in the wafer cassette 6. When the hand 44 is positioned on the back surface 4b side of the wafer 4, a gap is present between the back surface 4b of the wafer 4 and the hand 44, and each of the guide pins 48 is preliminarily positioned on the radial directionally outer side.

Next, compressed air is jetted from the air jet ports 46 of the hand 44 to generate a negative pressure on one surface side of the hand 44 by Bernoulli effect, and the wafer 4 is suction-supported from the back surface 4b side by the hand 44 on a non-contact basis. Next, each of the guide pins 48 is moved toward the radial directionally inner side, and horizontal movement of the wafer 4 suction-supported by the hand 44 is restricted by each of the guide pins 48. Then, the Y-axis movable member 32 and the conveying arm 42 of the wafer conveying-out mechanism 10 are moved, and the wafer 4 suction-supported by the hand 44 is conveyed out from the wafer cassette 6.

After the wafer conveying-out step is performed, a cutout detection step of detecting the position of the cutout 26 of the wafer 4 is preferably conducted. In the cutout detection step, as depicted in FIG. 4, the periphery of the wafer 4 suction-supported by the hand 44 is positioned between the light emitting element 52 and the light receiving element 54 of the cutout detection unit 50. Next, the wafer 4 is rotated by the drive source through the guide pins 48, whereby the position of the cutout 26 in the wafer 4 is detected. As a result, the orientation of the wafer 4 can be adjusted to any direction.

After the cutout detection step is performed, a wafer supporting step in which the front surface 4a side of the wafer 4 conveyed out by the wafer conveying-out mechanism 10 is supported by the wafer table 12 is carried out.

Referring to FIG. 3 for description, in the wafer supporting step, first, the hand 44 of the wafer conveying-out mechanism 10 is reversed upside down, to direct the front surface 4a of the wafer 4 downward. Next, the Y-axis movable member 32 and the conveying arm 42 of the wafer conveying-out mechanism 10 are moved, and the peripheral marginal area 20 of the front surface 4a of the wafer 4 suction-supported by the hand 44 is brought into contact with the annular support section 56 of the wafer table 12. In this instance, since the device area 18 on the front surface 4a of the wafer 4 is located at the recess 62 of the wafer table 12, the devices 14 and the wafer table 12 do not make contact with each other, so that damaging of the devices 14 is prevented.

Then, the suction source of the wafer table 12 is operated, to generate a suction force at each suction hole 60, whereby the peripheral marginal area 20 of the front surface 4a of the wafer 4 is suction-held. Subsequently, suction-support of the wafer 4 by the hand 44 is cancelled, and the hand 44 is spaced away from the wafer table 12. In this way, the wafer 4 is transferred from the wafer conveying-out mechanism 10 to the wafer table 12. Since the wafer 4 transferred to the wafer table 12 is suction-held by the suction holes 60, the position of the wafer 4 would not be deviated.

After the wafer cassette mounting step and the frame accommodating step are performed, a frame conveying-out step of conveying out the frame 64 from the frame accommodating device 66 is carried out concurrently with the wafer conveying-out step and the wafer supporting step.

Referring to FIG. 5 for description, in the frame conveying-out step, first, the X-axis movable member 84 and the Z-axis movable member 86 of the frame conveying-out mechanism 68 are moved, to bring the suction pads 92 of the holding section 88 into contact with the upper surface of the uppermost frame 64 accommodated in the frame accommodating device 66. Next, the suction source of the frame conveying-out mechanism 68 is operated, to generate a suction force at the suction pads 92, whereby the uppermost frame 64 is suction-held by the suction pads 92. Then, the X-axis movable member 84 and the Z-axis movable member 86 of the frame conveying-out mechanism 68 are moved, whereby the uppermost frame 64 suction-held by the suction pads 92 of the holding section 88 is conveyed out from the frame accommodating device 66.

After the frame conveying-out step is performed, a frame supporting step of supporting the frame 64 conveyed out by the frame conveying-out mechanism 68 by the frame table 70 is carried out.

Referring to FIG. 5 for continuing description, in the frame supporting step, first, the X-axis movable member 84 and the Z-axis movable member 86 of the frame conveying-out mechanism 68 are moved, to bring the frame 64 suction-held by the suction pads 92 into contact with the upper surface of the frame table 70. In this instance, the frame table 70 is preliminarily positioned at the lowered position (the position indicated by a solid line in FIG. 5). Next, the suction force of the suction pads 92 of the frame conveying-out mechanism 68 is cancelled, and the frame 64 is placed on the frame table 70. Then, the X-axis movable member 84 and the Z-axis movable member 86 of the frame conveying-out mechanism 68 are moved, to space the holding section 88 away from the upper side of the frame table 70.

After the frame supporting step is performed, a tape attaching step of attaching the tape 96 to the frame 64 is carried out.

Referring to FIGS. 6A and 6B for description, in the tape attaching step, first, before moving the frame table 70 from the lowered position (the position indicated in FIG. 6A) to the raised position (the position indicated in FIG. 6B) where the tape 96 can be attached to the frame 64, the tape 96 is preliminarily drawn out from the roll tape 96R and the tape 96 from which the release paper 116 has been peeled off is preliminarily positioned on an upper side of the frame table 70. Note that the tape 96 positioned on the upper side of the frame table 70 has the adhesive surface directed downward.

Next, the frame table 70 is raised to such an extent that the tape 96 can be pressed against the frame 64 from above by the pressing roller 132 of the pressure bonding section 110 of the tape attaching mechanism 98. Then, while pressing the adhesive surface of the tape 96 against the frame 64, the pressing roller 132 is rolled in the Y-axis direction. As a result, the tape 96 drawn out from the roll tape 96R by the tape drawing section 108 can be pressure bonded to the frame 64.

Next, the cutter 144 and the presser roller 146 of the cutting section 112 of the tape attaching mechanism 98 are lowered, to press the cutter 144 against the tape 96 on the frame 64 and to press the frame 64 from above the tape 96 by the presser roller 146. Subsequently, the arm piece 140 is rotated by the motor 138, and the cutter 144 and the presser roller 146 are moved such as to draw a circle along the frame 64. As a result, the tape 96 protruding to the periphery of the frame 64 can be cut along the frame 64. In addition, since the frame 64 is pressed from above the tape 96 by the presser roller 146, positional deviation of the frame 64 and the tape 96 during cutting of the tape 96 is prevented. Note that the used tape 96 formed with the circular opening 120 is taken up by the tape take-up section 106.

After the tape attaching step is performed, a tape-attached frame conveying step is carried out to convey the frame 64 with the tape 96 attached thereto to the wafer table 12 and to mount the tape-attached frame 64' on the wafer table 12, with the opening 64a of the frame 64 positioned at the back surface 4b of the wafer 4 supported by the wafer table 12.

In the tape-attached frame conveying step, first, the frame table 70 is moved from the raised position to the lowered position. Next, the Y-axis movable member 150 and the Z-axis movable member 152 of the tape-attached frame conveying mechanism 100 (see FIG. 5) are moved, to bring each of the suction pads 158 of the holding section 154 of the tape-attached frame conveying mechanism 100 into contact with the upper surface of the tape-attached frame 64' (see FIG. 7) supported on the frame table 70, with the adhesive surface of the tape 96 directed downward.

Then, the suction source of the tape-attached frame conveying mechanism 100 is operated, to generate suction forces at the suction pads 158, whereby the upper surface of the tape-attached frame 64' is suction-held by the suction pads 158. Subsequently, the Y-axis movable member 150 and the Z-axis movable member 152 of the tape-attached frame conveying mechanism 100 are moved, and the tape-attached frame 64' suction held by the suction pads 158 is conveyed out from the frame table 70.

Then, the tape-attached frame 64' suction-held by the suction pads 158 of the tape-attached frame conveying mechanism 100 is conveyed to the wafer table 12, and, as depicted in FIG. 7, the tape-attached frame 64' is put into contact with the frame support section 58 of the wafer table 12, while the opening 64a of the frame 64 is positioned at the back surface 4b of the wafer 4 supported by the wafer table 12. In this instance, the adhesive surface of the tape 96 of the tape-attached frame 64' is directed downward, and the back surface 4b of the wafer 4 is directed upward to face the adhesive surface of the tape 96.

Subsequently, the suction force of the suction pads 158 of the tape-attached frame conveying mechanism 100 is cancelled, and the tape-attached frame 64' is mounted on the frame support section 58 of the wafer table 12. Then, the Y-axis movable member 150 and the Z-axis movable member 152 of the tape-attached frame conveying mechanism 100 are moved, to space the holding section 154 away from the upper side of the wafer table 12.

After the tape-attached frame conveying step is performed, a tape pressure bonding step of pressure bonding the tape 96 of the tape-attached frame 64' to the back surface 4b of the wafer 4 is carried out.

Referring to FIGS. 7 to 9 for description, in the tape pressure bonding step, first, the upper chamber 160 is lowered by the lift mechanism 164 of the tape pressure bonding mechanism 102, and a lower end of the side wall 172 of the upper chamber 160 is brought into contact with an upper end of the side wall 186 of the lower chamber 162. As a result, the upper chamber 160 and the lower chamber 162 are put into a closed state, and the pressing roller 174 is put into contact with the tape-attached frame 64'. As a result, as depicted in FIG. 8, an upper end of the ring-shaped reinforcement section 24 of the wafer 4 is attached to the adhesive surface of the tape 96.

Next, the vacuum section 166 is operated in a state in which the atmospheric opening section 168 of the tape pressure bonding mechanism 102 is closed, to thereby establish a vacuum in the inside of the upper chamber 160 and the lower chamber 162. Subsequently, as depicted in FIGS. 8 and 9, the pressing roller 174 of the tape pressure bonding mechanism 102 is rolled in the Y-axis direction, whereby the tape 96 is pressure bonded to the back surface 4b of the wafer 4. As a result, a frame unit U in which the back surface 4b of the wafer 4 and the tape 96 are pressure bonded can be produced. Then, the atmospheric opening section 168 is opened, and the tape 96 is put into close contact with the back surface 4b of the wafer 4 along the base of the ring-shaped reinforcement section 24 by the atmospheric pressure. Following this, the upper chamber 160 is raised by the lift mechanism 164. Note that, while the suction force on the wafer 4 by the wafer table 12 is lost due to the establishment of a vacuum in the inside of the upper chamber 160 and the lower chamber 162, the upper end of the ring-shaped reinforcement section 24 of the wafer 4 is attached to the adhesive surface of the tape 96 of the tape-attached frame 64' when the upper chamber 160 and the lower chamber 162 are put into the closed state, and, thus, the position of the wafer 4 would not be deviated during the tape pressure bonding step.

After the tape pressure bonding step is performed, a frame unit conveying-out step is carried out to convey the frame unit U in which the tape 96 of the tape-attached frame 64' and the back surface 4b of the wafer 4 are pressure bonded out from the wafer table 12.

Referring to FIG. 5 for description, in the frame unit conveying-out step, first, the conveying section 206 of the frame unit conveying-out mechanism 192 is operated, to bring the lower surface of the suction piece 210 of the wafer holding section 202a of the frame unit holding section 202 into contact with the tape 96 on the back surface 4b side of the wafer 4, and to bring the suction pads 214 of the frame holding section 202b into contact with the frame 64.

Next, a suction force is generated at the suction piece 210 of the wafer holding section 202a and the suction pads 214 of the frame holding section 202b, and the back surface 4b side (the tape 96 side) of the wafer 4 is suction-held by the suction piece 210 of the wafer holding section 202a, and the frame 64 is suction-held by the suction pads 214 of the frame holding section 202b. Subsequently, the suction-holding of the wafer 4 by the wafer table 12 is cancelled. Then, the conveying section 206 is operated, to convey out the frame unit U held by the frame unit holding section 202 from the wafer table 12.

After the frame unit conveying-out step is performed, a temporary placing step is conducted to make the center of the wafer 4 coincide with the center of the temporary placing table 204 and to temporarily place the frame unit U on the temporary placing table 204.

Referring to FIG. 10 for description, in the temporary placing step, first, the frame unit U held by the frame unit holding section 202 is positioned on an upper side of the imaging section 224. Next, the conveying section 206 constituting the two-dimensional moving mechanism of the frame unit conveying-out mechanism 192 is operated, and at least three parts of the periphery of the wafer 4 of the frame unit U held by the frame unit holding section 202 are imaged by the imaging section 224. As a result, the coordinates of the at least three points of the periphery of the wafer 4 are measured. Subsequently, the coordinates of the center of the wafer 4 are obtained based on the coordinates of the three points measured.

Then, the conveying section 206 is operated, to position the center of the wafer 4 to the center of the annular support section 226 of the temporary placing table 204, thereby bringing the peripheral marginal area 20 of the front surface 4a of the wafer 4 into contact with the upper surface of the annular support section 226 of the temporary placing table 204, and bringing the lower surface of the frame 64 into contact with the upper surface of the frame support section 228 of the temporary placing table 204. In this instance, though the front surface 4a of the wafer 4 is directed downward, the device area 18 is positioned at the recess 230 of the temporary placing table 204, and, thus, the devices 14 and the temporary placing table 204 would not make contact with each other, so that damaging of the devices 14 is prevented.

Subsequently, the suction-holding of the wafer 4 by the wafer holding section 202a is cancelled, the suction-holding of the frame 64 by the frame holding section 202b is cancelled, and the frame unit U is transferred from the frame unit conveying-out mechanism 192 to the temporary placing table 204. Following this, the heater of the frame support section 228 is operated, and the tape 96 of the frame unit U temporarily placed on the temporary placing table 204 is heated by the heater. As a result, the tape 96 is softened, and the tape 96 is put into close contact with the base of the ring-shaped reinforcement section 24 of the wafer 4.

After the temporary placing step is performed, a reinforcement section removing step is carried out to cut and remove the ring-shaped reinforcement section 24 from the wafer 4 of the frame unit U conveyed out by the frame unit conveying-out mechanism 192.

Referring to FIGS. 1, 10, and 12 for description, in the reinforcement section removing step, first, the X-axis movable member 260 and the Z-axis movable member 262 of the first lift table 246 of the reinforcement section removing mechanism 194 are moved, to bring the lower surface of the suction piece 268 into contact with the upper surface of the frame 64 of the frame unit U temporarily placed on the temporary placing table 204. Next, a suction force is generated at each of the suction holes of the suction piece 268 of the first lift table 246, and the part of the frame 64 of the frame unit U is suction-held.

Subsequently, the X-axis movable member 260 and the Z-axis movable member 262 of the first lift table 246 are operated, to position the frame unit U suction-held by the suction piece 268 on an upper side of the laser beam applying unit 244, as depicted in FIG. 11. Next, the concentrating point of the laser beam LB is positioned at the base of the ring-shaped reinforcement section 24 of the wafer 4 of the frame unit U.

Then, while the suction piece 268 and the frame unit U are rotated by the motor 266 of the first lift table 246, the laser beam LB is applied to the base of the ring-shaped reinforcement section 24 of the wafer 4. As a result, ablation is applied to the base of the ring-shaped reinforcement section 24 of the wafer 4, whereby a ring-shaped cut groove 256 can be formed. In addition, when the laser beam LB is applied to the wafer 4, the suction source of the laser beam applying unit 244 is operated to generate a suction force at the suction nozzle 254, whereby the debris generated by ablation is sucked by the suction nozzle 254.

Following this, the X-axis movable member 260 and the Z-axis movable member 262 of the first lift table 246 are moved, to bring the peripheral marginal area 20 of the front surface 4a of the wafer 4 of the frame unit U suction-held by the suction piece 268 into contact with the upper surface of the annular support section 226 of the temporary placing table 204, and to bring the lower surface of the frame 64 into contact with the upper surface of the frame support section 228 of the temporary placing table 204. Subsequently, the suction force of the suction piece 268 of the first lift table 246 is cancelled, and the frame unit U is transferred from the first lift table 246 to the temporary placing table 204.

Then, the temporary placing table 204 having received the frame unit U is positioned on a lower side of the separating section 248 of the reinforcement section removing mechanism 194 by the temporary placing table conveying section 232 (see FIG. 10). Note that, in this instance, the belt conveyor 300 of the discarding section 276 is preliminarily positioned at a standby position. Subsequently, the second lift table 272 of the separating section 248 is lowered, and the lower surface of the second lift table 272 is put into contact with the tape 96 at the part of the back surface 4b of the wafer 4. Then, a suction force is generated at the lower surface of the second lift table 272, to suction-hold the back surface 4b side of the wafer 4 of the frame unit U by the second lift table 272.

Following this, the second lift table 272 suction-holding the wafer 4 of the frame unit U is raised, to space the frame unit U away from the temporary placing table 204, and to move the temporary placing table 204 to a lower side of the first lift table 246. Next, as depicted in FIG. 14, the pair of feeding mechanisms 290 and the Z-axis feeding mechanism 294 of the separator 274 are operated, to vertically clamp the frame 64 by the upper and lower clamping rollers 292a and 292b. Further, the belt conveyor 300 of the discarding section 276 is moved from the standby position to be positioned at the recovery position.

Subsequently, ultraviolet rays are applied from the pair of ultraviolet ray applying sections 270 to reduce the adhesive force of the tape 96 attached to the ring-shaped reinforcement section 24, and, while the ring-shaped reinforcement section 24 is pressed downward by the pressing roller 298, the frame unit U is rotated together with the support shaft 286 and the second lift table 272 by the motor 284 relative to the separator 274. As a result, the ring-shaped reinforcement section 24 can be separated from the frame unit U. The reinforcement section 24 falling off from the frame unit U is conveyed by the belt conveyor 300 to and recovered by the dust box 302. Note that, when the reinforcement section 24 is to be separated, the separator 274 may be rotated relative to the frame unit U.

After the reinforcement section removing step is performed, a ringless unit conveying-out step of conveying out the ringless unit U' with the ring-shaped reinforcement section 24 removed therefrom from the reinforcement section removing mechanism 194 is carried out.

In the ringless unit conveying-out step, first, the belt conveyor 300 of the discarding section 276 of the reinforcement section removing mechanism 194 is moved from the recovery position to be positioned at the standby position. Next, the frame holding section 306 of the reversing mechanism 308 (see FIG. 16) of the ringless unit conveying-out mechanism 196 is positioned on a lower side of the ringless unit U' suction-held by the second lift table 272.

Subsequently, the arm 318 is raised with the suction pads 326 of the frame holding section 306 directed upward, and the suction pads 326 of the frame holding section 306 are put into contact with the lower surface side of the frame 64 of the ringless unit U' that is supported by the second lift table 272 and that has the front surface 4a of the wafer 4 directed downward.

Then, a suction force is generated at the suction pads 326 of the frame holding section 306, whereby the frame 64 of the ringless unit U' is suction-held by the suction pads 326. Subsequently, the suction holding of the ringless unit U' by the second lift table 272 is cancelled. As a result, the ringless unit U' is transferred from the second lift table 272 of the reinforcement section removing mechanism 194 to the frame holding section 306 of the ringless unit conveying-out mechanism 196.

After the ringless unit conveying-out step is performed, a ringless unit accommodating step is carried out to accommodate the ringless unit U' out by the ringless unit conveying-out mechanism 196.

In the ringless unit accommodating step, first, the reversing mechanism 308 of the ringless unit conveying-out mechanism 196 is reversed upside down, whereby the ringless unit U' suction-held by the frame holding section 306 is reversed upside down. As a result, the ringless unit U' is positioned on a lower side of the frame holding section 306, and the front surface 4a of the wafer 4 is directed upward.

Next, the Y-axis movable member 316 and the arm 318 of the reversing mechanism 308 are moved, to bring the ringless unit U' into contact with the upper surfaces of the pair of support plates 328 of the ringless unit support section 310. In this instance, the gap between the pair of support plates 328 is narrowed by the gap adjusting mechanism, and the pair of support plates 328 are in close contact with each other. Then, the suction holding of the ringless unit U' by the frame holding section 306 is cancelled, and the ringless unit U' is mounted on the pair of support plates 328. Subsequently, the heater mounted to each of the support plates 328 is operated, to heat the tape 96 of the ringless unit U', whereby sag and wrinkles of the tape 96 generated by the removal of the reinforcement section 24 are stretched. Then, the ringless unit U' is suction-held again by the frame holding section 306 and is raised.

Following this, the gap between the pair of support plates 328 is widened by the gap adjusting mechanism, after which the ringless unit U' is mounted on the upper surface of the support plates 328. Then, as depicted in FIG. 18, the ringless unit U' supported by the ringless unit support section 310 is pressed by the pressing piece 338 of the pushing-in section 312, and is made to enter and to be accommodated into the frame cassette 198 mounted on the frame cassette table 200.

As described above, in the processing apparatus 2 in the embodiment illustrated, it is easy to perform the operation of attaching the tape 96 to the back surface 4b of the wafer 4 formed with the ring-shaped reinforcement section 24 in a projection form on the back surface 4b corresponding to the peripheral marginal area 20, to unite the wafer 4 with the frame 64, and it is easy to cut and remove the ring-shaped reinforcement section 24 from the wafer 4, so that productivity is good.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for removing, from a wafer formed with a ring-shaped reinforcement section in a projection form on a back surface corresponding to a peripheral marginal area, the projection-shaped reinforcement section, the processing apparatus comprising:
   a wafer cassette table on which a wafer cassette accommodating a plurality of wafers is to be placed;
   a wafer conveying-out mechanism that conveys out a wafer from the wafer cassette placed on the wafer cassette table;
   a wafer table that supports a front surface side of the wafer conveyed out by the wafer conveying-out mechanism;
   a frame accommodating device that accommodates a plurality of ring-shaped frames each formed with an opening for accommodating the wafer;
   a frame conveying-out mechanism that conveys out a frame from the frame accommodating device;
   a frame table that supports the frame conveyed out by the frame conveying-out mechanism;
   a tape attaching mechanism that is disposed on an upper side of the frame table and that attaches a tape to the frame;
   a tape-attached frame conveying mechanism that conveys the tape-attached frame to the wafer table, positions the opening of the frame to the back surface of the wafer supported by the wafer table, and places the tape-attached frame on the wafer table;
   a tape pressure bonding mechanism that pressure bonds the tape of the tape-attached frame to the back surface of the wafer including the ring-shaped reinforcement section, wherein the tape pressure bonding mechanism includes a vacuum section that establishes a vacuum within the tape pressure bonding mechanism;
   a frame unit conveying-out mechanism that conveys out, from the wafer table, a frame unit in which the tape of the tape-attached frame and the back surface of the wafer are pressure bonded by the tape pressure bonding mechanism;
   a reinforcement section removing mechanism that cuts and removes the ring-shaped reinforcement section from the wafer of the frame unit conveyed out by the frame unit conveying-out mechanism;
   a ringless unit conveying-out mechanism that conveys out, from the reinforcement section removing mechanism, a ringless unit from which the ring-shaped reinforcement section has been removed; and
   a frame cassette table on which the frame cassette accommodating the ringless unit conveyed out by the ringless unit conveying-out mechanism is to be placed,
   wherein the tape pressure bonding mechanism includes an upper chamber disposed on an upper side of the wafer table and a lower chamber that accommodates the wafer table; and
   wherein the vacuum section is configured and arranged to establish a vacuum within the upper chamber and the lower chamber.

2. The processing apparatus according to claim 1, wherein the wafer conveying-out mechanism includes a conveying arm and a hand that is disposed at a tip of the conveying arm, that supports the back surface of the wafer accommodated in the wafer cassette, and that reverses the wafer face side back.

3. The processing apparatus according to claim 2, wherein the hand is a Bernoulli pad in which a negative pressure is generated by jetting of air and the wafer is supported on a non-contact basis.

4. The processing apparatus according to claim 1, wherein the wafer table includes an annular support section that supports the peripheral marginal area of the wafer, with a part on an inner side than the peripheral marginal area in a non-contact state, and a frame support section that is disposed at a periphery of the annular support section and supports the frame.

5. The processing apparatus according to claim 1, wherein the tape attaching mechanism includes a roll tape support section that supports a roll tape in which the tape before use is rolled, a tape take-up section that takes up used tape, a tape drawing section that draws out the tape from the roll tape, a pressure bonding section that pressure bonds the drawn-out tape to the frame, and a cutting section that cuts, along the frame, the tape protruding to the periphery of the frame.

6. The processing apparatus according to claim 1, wherein the frame unit conveying-out mechanism includes a frame unit holding section that includes a wafer holding section for holding the wafer and a frame holding section for holding the frame and a conveying section that conveys the frame unit holding section to a temporary placing table.

7. The processing apparatus according to claim 6, wherein the frame unit conveying-out mechanism includes a two-dimensional moving mechanism that moves the frame unit holding section on a two-dimensional basis in horizontal directions and an imaging section that images a periphery of the wafer of the frame unit held by the frame unit holding section, and the two-dimensional moving mechanism is operated to image at least three parts of the periphery of the wafer by the imaging section, the coordinates of the center of the wafer are obtained, and the center of the wafer is made to coincide with the center of the temporary placing table.

8. The processing apparatus according to claim 1, wherein the reinforcement section removing mechanism includes a laser beam applying unit that applies a laser beam toward a base of the ring-shaped reinforcement section formed at a periphery of the wafer and forms a cut groove.

9. The processing apparatus according to claim 1, wherein the wafer table includes an annular support section that supports the peripheral marginal area of the wafer, and further wherein the annular support section of the wafer table is surrounded by a frame support section that supports the frame of the tape-attached frame.

10. A processing apparatus for removing, from a wafer formed with a ring-shaped reinforcement section in a projection form on a back surface corresponding to a peripheral marginal area, the projection-shaped reinforcement section, the processing apparatus comprising:

a wafer cassette table on which a wafer cassette accommodating a plurality of wafers is to be placed;
a wafer conveying-out mechanism that conveys out a wafer from the wafer cassette placed on the wafer cassette table;
a wafer table that supports a front surface side of the wafer conveyed out by the wafer conveying-out mechanism;
a frame accommodating device that accommodates a plurality of ring-shaped frames each formed with an opening for accommodating the wafer;
a frame conveying-out mechanism that conveys out a frame from the frame accommodating device;
a frame table that supports the frame conveyed out by the frame conveying-out mechanism;
a tape attaching mechanism that is disposed on an upper side of the frame table and that attaches a tape to the frame;
a tape-attached frame conveying mechanism that conveys the tape-attached frame to the wafer table, positions the opening of the frame to the back surface of the wafer supported by the wafer table, and places the tape-attached frame on the wafer table;
a tape pressure bonding mechanism that pressure bonds the tape of the tape-attached frame to the back surface of the wafer including the ring-shaped reinforcement section, wherein the tape pressure bonding mechanism includes a vacuum section that establishes a vacuum within the tape pressure bonding mechanism;
a frame unit conveying-out mechanism that conveys out, from the wafer table, a frame unit in which the tape of the tape-attached frame and the back surface of the wafer are pressure bonded by the tape pressure bonding mechanism;
a reinforcement section removing mechanism that cuts and removes the ring-shaped reinforcement section from the wafer of the frame unit conveyed out by the frame unit conveying-out mechanism;
a ringless unit conveying-out mechanism that conveys out, from the reinforcement section removing mechanism, a ringless unit from which the ring-shaped reinforcement section has been removed; and
a frame cassette table on which the frame cassette accommodating the ringless unit conveyed out by the ringless unit conveying-out mechanism is to be placed,
wherein the tape pressure bonding mechanism includes an upper chamber disposed on an upper side of the wafer table, a lower chamber that accommodates the wafer table, a lift mechanism that moves the upper chamber upward and downward to generate a closed state in which the upper chamber is in contact with the lower chamber and an open state in which the upper chamber is spaced away from the lower chamber, wherein the vacuum section establishes a vacuum in the upper chamber and the lower chamber in the closed state, and an atmospheric opening section that opens the upper chamber and the lower chamber to the atmosphere, and
in a state in which the tape of the tape-attached frame is positioned on the back surface of the wafer supported by the wafer table, the lift mechanism is operated to establish a vacuum in the upper chamber and the lower chamber while the closed state is maintained, and the tape of the tape-attached frame is pressure bonded to the back surface of the wafer by a pressing roller disposed in the upper chamber.

11. A processing apparatus for removing, from a wafer formed with a ring-shaped reinforcement section in a projection form on a back surface corresponding to a peripheral marginal area, the projection-shaped reinforcement section, the processing apparatus comprising:

a wafer cassette table on which a wafer cassette accommodating a plurality of wafers is to be placed;
a wafer conveying-out mechanism that conveys out a wafer from the wafer cassette placed on the wafer cassette table;
a wafer table that supports a front surface side of the wafer conveyed out by the wafer conveying-out mechanism;

a frame accommodating device that accommodates a plurality of ring-shaped frames each formed with an opening for accommodating the wafer;

a frame conveying-out mechanism that conveys out a frame from the frame accommodating device;

a frame table that supports the frame conveyed out by the frame conveying-out mechanism;

a tape attaching mechanism that is disposed on an upper side of the frame table and that attaches a tape to the frame;

a tape-attached frame conveying mechanism that conveys the tape-attached frame to the wafer table, positions the opening of the frame to the back surface of the wafer supported by the wafer table, and places the tape-attached frame on the wafer table;

a tape pressure bonding mechanism that pressure bonds the tape of the tape-attached frame to the back surface of the wafer including the ring-shaped reinforcement section, wherein the tape pressure bonding mechanism includes a vacuum section that establishes a vacuum within the tape pressure bonding mechanism;

a frame unit conveying-out mechanism that conveys out, from the wafer table, a frame unit in which the tape of the tape-attached frame and the back surface of the wafer are pressure bonded by the tape pressure bonding mechanism;

a reinforcement section removing mechanism that cuts and removes the ring-shaped reinforcement section from the wafer of the frame unit conveyed out by the frame unit conveying-out mechanism;

a ringless unit conveying-out mechanism that conveys out, from the reinforcement section removing mechanism, a ringless unit from which the ring-shaped reinforcement section has been removed; and a frame cassette table on which the frame cassette accommodating the ringless unit conveyed out by the ringless unit conveying-out mechanism is to be placed, wherein the frame unit conveying-out mechanism includes a frame unit holding section that includes a wafer holding section for holding the wafer and a frame holding section for holding the frame and a conveying section that conveys the frame unit holding section to a temporary placing table, wherein the reinforcement section removing mechanism includes a laser beam applying unit that applies a laser beam toward a base of the ring-shaped reinforcement section formed at a periphery of the wafer and forms a cut groove, a first lift table that holds and raises the frame unit temporarily placed on the temporary placing table, to position the frame unit at the laser beam applying unit, and a separating section that separates the ring-shaped reinforcement section from the cut groove, wherein the separating section includes an ultraviolet ray applying section that applies ultraviolet rays to the tape corresponding to the cut groove, to lower an adhesive force of the tape, a second lift table that suction-holds an inside of the wafer while exposing the ring-shaped reinforcement section on the periphery and supports the frame, a separator that acts on a periphery of the ring-shaped reinforcement section to separate the ring-shaped reinforcement section, and a discarding section that discards the separated ring-shaped reinforcement section, and wherein the first lift table temporarily places, on the temporary placing table, the frame unit formed with the cut groove, the temporary placing table is positioned at the separating section by a table conveying section, and the second lift table supports the frame unit temporarily placed on the temporary placing table.

12. The processing apparatus according to claim 11, wherein the temporary placing table includes a heater, and the first lift table holds, from the temporary placing table, the frame unit in which the tape is heated by the heater and the tape is put into close contact with the base of the ring-shaped reinforcement section.

13. The processing apparatus according to claim 12, wherein the ringless unit conveying-out mechanism includes:

a reversing mechanism that includes a frame holding section facing the ringless unit supported by the second lift table and holding the frame, moves toward the frame cassette table, and reverses the frame holding section, a ringless unit support section that supports the ringless unit being reversed by the reversing mechanism and having the front surface of the wafer directed upward, and a pushing-in section that causes the ringless unit supported by the ringless unit support section to enter into the frame cassette placed on the frame cassette table and to be accommodated in the frame cassette.

14. The processing apparatus according to claim 11, wherein the temporary placing table includes an annular support section that supports the peripheral marginal area of the wafer and puts a part on an inner side than the peripheral marginal area in a non-contact state and a frame support section that is disposed at a periphery of the annular support section and supports the frame.

15. The processing apparatus according to claim 11, wherein:

the tape pressure bonding mechanism includes an upper chamber disposed on an upper side of the wafer table and a lower chamber that accommodates the wafer table; and the vacuum section is configured and arranged to establish a vacuum within the upper chamber and the lower chamber.

* * * * *